United States Patent
Nagano

(10) Patent No.: US 7,142,382 B2
(45) Date of Patent: Nov. 28, 2006

(54) PHASE ADJUSTMENT CIRCUIT AND DEMODULATION CIRCUIT

(75) Inventor: Kouichi Nagano, Osaka (JP)

(73) Assignee: Matsushita Electric Industrial Co., Ltd., Osaka (JP)

( * ) Notice: Subject to any disclaimer, the term of this patent is extended or adjusted under 35 U.S.C. 154(b) by 305 days.

(21) Appl. No.: 10/944,917

(22) Filed: Sep. 21, 2004

(65) Prior Publication Data

US 2005/0063492 A1    Mar. 24, 2005

(30) Foreign Application Priority Data

Sep. 22, 2003    (JP)    ............... 2003-329592

(51) Int. Cl.
*G11B 5/09* (2006.01)
*G11B 27/10* (2006.01)

(52) U.S. Cl. .................. 360/51; 360/29; 360/49
(58) Field of Classification Search .............. 360/29, 360/49, 51
See application file for complete search history.

(56) References Cited

U.S. PATENT DOCUMENTS 3,637,936 A * 1/1972 Krause ................. 386/18
4,607,360 A * 8/1986 Fukui ................... 369/47.28
4,631,600 A * 12/1986 Fukui ................... 386/15
4,956,720 A * 9/1990 Tomisawa ............. 386/21

FOREIGN PATENT DOCUMENTS

| JP | 62-154886 | 7/1987 |
|---|---|---|
| JP | 5-260413 | 10/1993 |
| JP | 6-19898 | 3/1994 |
| JP | 2001-126413 | 5/2001 |

* cited by examiner

Primary Examiner—David Mis
(74) Attorney, Agent, or Firm—McDermott Will & Emery LLP

(57) ABSTRACT

A phase adjustment circuit includes: a carrier-wave-delay adjusting circuit for delaying an input carrier wave and outputting the delayed carrier wave, in accordance with phase information; and a phase-difference detecting/adjusting circuit for detecting a phase difference between an input signal and the delayed carrier wave, outputting, as the phase information, a value according to the detected phase difference, adjusting the delayed carrier wave such that the delayed carrier wave has a phase substantially coincident with a phase of the input signal, and outputting the resultant carrier wave as a phase-adjusted carrier wave. In a steady state, the phase-difference detecting/adjusting circuit outputs, as the phase information, a value indicating the presence of a phase difference.

30 Claims, 20 Drawing Sheets

PHASE ADJUSTMENT CIRCUIT AND DEMODULATION CIRCUIT

CROSS-REFERENCE TO RELATED APPLICATION

This application is related to Japanese Patent Application No. 2003-329592 filed on Sep. 22, 2003, whose priority is claimed under 35 USC §119, the disclosure of which is incorporated by reference in its entirety.

BACKGROUND OF THE INVENTION

The present invention relates to recording/reproducing devices for optical disks with wobbled grooves where address information is recorded, and particularly relates to demodulation circuits for demodulating addresses.

On an optical disk such as a DVD (digital versatile disk)+R disk and a DVD+RW disk, an address is recorded by utilizing a sinusoidally serpentine groove (wobbled groove). The address thus recorded is called address in pre-groove (ADIP).

A signal obtained by irradiating the optical disk with light and converting the reflected light into an electric signal is a wobble signal modulated by a wobbled groove. Use of this wobble signal enables highly-accurate address detection.

FIG. 18 is a graph showing an example of a waveform of a wobble signal. As shown in FIG. 18, the wobble signal is modulated by a binary phase shift keying (BPSK) scheme. Demodulation circuits for demodulating such wobble signals are disclosed in Japanese Examined Patent Publication (Kokoku) No. 6-19898, Japanese Unexamined Patent Publication (Kokai) No. 5-260413 and Japanese Unexamined Patent Publication (Kokai) No. 2001-126413.

FIG. 19 is a block diagram showing a configuration of a known demodulation circuit. A demodulation circuit 900 shown in FIG. 19 includes a band-pass filter (BPF) 3, a multiplier 4, a low-pass filter (LPF) 5, a binarization circuit 6 and a phase adjustment circuit 910.

An LPF 1 removes noise at high frequencies from a wobble signal WB input to the LPF 1 and outputs the resultant signal. An A/D converter 2 converts this signal into a digital signal. The BPF 3 further removes noise from the output from the A/D converter 2 and outputs the resultant wobble signal WDF to the multiplier 4 and the phase adjustment circuit 910. The phase adjustment circuit 910 receives a carrier wave CB generated by a PLL. The carrier wave CB has the same period as the wobble signal WB. The phase adjustment circuit 910 detects a phase difference between the wobble signal WDF and the carrier wave CB, adjusts the phase of the carrier wave CB so that the phase of the carrier wave CB coincides with that of the wobble signal WDF, and outputs the result to the multiplier 4.

The multiplier 4 multiples the output of the BPF 3 and the output of the phase adjustment circuit 910 together and outputs the result to the LPF 5. The LPF 5 smoothes the output of the multiplier 4. The binalization circuit 6 compares the output of the LPF 5 with a threshold value and outputs the comparison result. In this manner, an address recorded on a wobbled groove is demodulated.

FIG. 20A is a graph showing a relationship between the carrier wave CB and the wobble signal WDF in a case where the phase of the carrier wave CB slightly leads the phase of the wobble signal WDF. FIG. 20B is a graph showing a relationship between the carrier wave CB and the wobble signal WDF in a case where the phase of the carrier wave CB slightly lags behind the phase of the wobble signal WDF.

The phase adjustment circuit 910 detects the time from when the wobble signal WDF exceeds a predetermined value to the rising of the carrier wave CB. In the case of FIG. 20A, the phase adjustment circuit 910 detects a value P1 close to 360° as a phase difference. In the case of FIG. 20B, the carrier wave CB is slightly behind the case of FIG. 20A, but the phase adjustment circuit 910 detects a small value P2 close to 0° as a phase difference.

Accordingly, if the phase difference between the wobble signal WDF and the carrier wave CB input to the phase adjustment circuit 910 shown in FIG. 19 is small, the detected phase difference changes considerably only by a small variation in signal phase due to the influences of offset variation, amplitude variation, jitter and others in some cases. In such cases, the phase adjustment circuit 910 cannot cope with this change, and therefore does not appropriately adjust the phase of the carrier wave CB, resulting in failure in address demodulation.

SUMMARY OF THE INVENTION

It is therefore an object of the present invention to provide a phase adjustment circuit for adjusting a phase difference between an input signal and a carrier wave with stability and a demodulation circuit for demodulating the input signal with stability.

Specifically, according to the present invention, a phase adjustment circuit includes: a carrier-wave-delay adjusting circuit for delaying an input carrier wave and outputting the delayed carrier wave, in accordance with phase information; and a phase-difference detecting/adjusting circuit for detecting a phase difference between an input signal and the delayed carrier wave, outputting, as the phase information, a value according to the detected phase difference, adjusting the delayed carrier wave such that the delayed carrier wave has a phase substantially coincident with a phase of the input signal, and outputting the resultant carrier wave as a phase-adjusted carrier wave, wherein in a steady state, the phase-difference detecting/adjusting circuit outputs, as the phase information, a value indicating the presence of a phase difference.

In this circuit, in a steady state, a value indicating the presence of a phase difference is output as phase information. Accordingly, when the phase difference is always represented by zero or a positive value, the phase difference does not take a value around zero and a value close to one period of a carrier wave successively. This enables stable output of a carrier wave whose phase substantially coincides with the phase of the input signal.

It is preferable that the phase adjustment circuit further includes a carrier-wave forming circuit for converting the delayed carrier wave into a carrier wave with a different waveform and outputting the resultant carrier wave, and the phase-difference detecting/adjusting circuit performs processing using the output from the carrier-wave forming circuit.

Then, the waveform of the carrier wave is converted into a waveform suitable for demodulation. Accordingly, more accurate demodulation is achieved. In addition, the waveform conversion is carried out after the carrier wave has been delayed, so that increase in scale of a circuit for delaying the carrier wave is suppressed.

It is also preferable that the phase adjustment circuit further includes a carrier-wave forming circuit for converting an input carrier wave into a carrier wave with a different waveform and outputting the resultant carrier wave, and the carrier-wave-delay adjusting circuit performs processing using the output from the carrier-wave forming circuit.

Then, the waveform of the carrier wave is converted into a waveform suitable for demodulation.

It is also preferable that the carrier-wave-delay adjusting circuit includes: a delay-control-signal generating circuit for generating and outputting a delay control signal for controlling a delay to be provided to the input carrier wave, based on the phase information; and a delay selecting circuit for providing the delay to the input carrier wave and outputting the delayed carrier wave, in accordance with the delay control signal.

In such a case, the delay-control-signal generating circuit preferably includes: a subtractor for subtracting a first value from the phase information and outputting the result; an integrator for integrating the output from the subtractor and outputting the result; and an adder for adding a second value to the output from the integrator and outputting the result as the delay control signal.

It is preferable that the delay-control-signal generating circuit further includes a multiplier for multiplying the output from the subtractor by a coefficient and outputting the result, and the integrator integrates the output from the multiplier and outputting the result.

Then, the response in control of providing a delay to the carrier wave is appropriately set by setting a time constant for integration in the delay-control-signal generating circuit to an appropriate value.

The multiplier preferably uses a value input to the multiplier as the coefficient.

Then, a time constant for integration in the delay-control-signal generating circuit is easily changed. For example, the time constant is set large at the beginning of the control while being set small after the lapse of a given time.

It is preferable that the delay-control-signal generating circuit further includes a positive/negative determination circuit for determining whether the output from the subtractor is positive or negative and outputting the result, and the integrator integrates the output from the positive/negative determination circuit and outputs the result.

Then, the positive/negative determination circuit outputs the determination result on whether the output is positive or negative, so that the scale of a circuit such as the integrator is reduced.

It is preferable that the delay-control-signal generating circuit further includes: a first multiplier for multiplying the output from the subtractor by a first coefficient and outputting the result; a second multiplier for multiplying the output from the subtractor by a second coefficient and outputting the result; a comparator for comparing the output from the subtractor with the value of a control signal input to the comparator, and outputting the result; and a selector for selecting one of the outputs from the first and second multipliers, in accordance with the output from the comparator, and the integrator integrates the output from the selector and outputs the result.

Then, the output of the subtractor is large at the beginning of the control and then gradually decreases, so that the time constant for integration in the delay-control-signal generating circuit is changed easily.

The delay-control-signal generating circuit preferably includes: a comparator for comparing the phase information with a first value and outputting the result of the comparison; an integrator for integrating the result of the comparison and outputting the result of the integration; and an adder for adding a second value to the output from the integrator and outputting the result as the delay control signal.

Then, use of the comparator achieves a smaller circuit scale than in a case where a subtractor is used.

The delay selecting circuit preferably includes: a delay circuit for providing a delay to the input carrier wave and generating and outputting a plurality of carrier waves respectively provided with different delays; and a selector for selecting one of the plurality of carrier waves and outputting the selected carrier wave, in accordance with the delay control signal.

It is preferable that the phase-difference detecting/adjusting circuit provides a delay to the delayed carrier wave, generates a plurality of carrier waves respectively provided with different delays, selects one of the plurality of carrier waves and outputs the selected carrier wave as the phase-adjusted carrier wave, and the maximum value of the delays provided by the phase-difference detecting/adjusting circuit is smaller than the maximum value of the delays provided by the delay selecting circuit.

According to the present invention, a demodulation circuit includes: a phase adjustment circuit including a carrier-wave-delay adjusting circuit for delaying an input carrier wave and outputting the delayed carrier wave, in accordance with phase information, and a phase-difference detecting/adjusting circuit for detecting a phase difference between an input signal and the delayed carrier wave, outputting, as the phase information, a value according to the detected phase difference, adjusting the delayed carrier wave such that the delayed carrier wave has a phase substantially coincident with a phase of the input signal, and outputting the resultant carrier wave as a phase-adjusted carrier wave, the phase-difference detecting/adjusting circuit outputting, as the phase information, a value indicating the presence of a phase difference in a steady state; a multiplier for multiplying the input signal and the phase-adjusted carrier wave together; and a binarization circuit for comparing the result of the multiplication by the multiplier with a threshold value and outputting the result of the comparison.

The demodulation circuit includes the phase adjustment circuit capable of outputting a carrier wave whose phase substantially coincides with the phase of an input signal with stability, so that stable demodulation of the input signal is achieved. Accordingly, if the input signal is modulated using address information, accurate address information is obtained.

According to the present invention, a phase adjustment circuit includes: a carrier-wave-delay adjusting circuit for delaying an input carrier wave and outputting the delayed carrier wave, in accordance with phase information; and a phase-difference detecting circuit for detecting a phase difference between an input signal and a signal according to the delayed carrier wave, and outputting, as the phase information, a value according to the detected phase difference, wherein in a steady state, the phase-difference detecting circuit outputs, as the phase information, a value indicating the presence of a phase difference, and the carrier-wave-delay adjusting circuit delays the input carrier wave in such a manner that the delayed carrier wave or a carrier wave generated from the delayed carrier wave is output as a phase-adjusted carrier wave having a phase substantially coincident with a phase of the input signal.

In this circuit, a carrier wave whose phase substantially coincides with the phase of an input signal is output with stability. In addition, a delay to be provided to the carrier wave is adjusted only in the carrier-wave-delay adjusting circuit, so that the circuit scale is relatively small.

The phase adjustment circuit preferably further includes a carrier-wave forming circuit for converting the delayed carrier wave into a carrier wave with a different waveform and outputting the resultant carrier wave as the phase-adjusted carrier wave.

It is also preferable that the phase adjustment circuit further includes a carrier-wave forming circuit for converting an input carrier wave into a carrier wave with a different waveform and outputting the resultant carrier wave, and the carrier-wave-delay adjusting circuit performs processing using the output from the carrier-wave forming circuit and outputs the delayed carrier wave as the phase-adjusted carrier wave.

It is also preferable that the phase adjustment circuit further includes a delay circuit for further providing a delay to the delayed carrier wave and outputting the resultant carrier wave, and the phase-difference detecting circuit detects a phase difference between the input signal and the output from the delay circuit.

In such a case, the delay circuit is preferably configured to control the amount of the delay to be provided to the delayed carrier wave.

The phase-difference detecting circuit preferably adds an offset to the detected phase difference and outputs the result as the phase information.

The carrier-wave-delay adjusting circuit preferably provides a first delay to the input carrier wave to output the resultant carrier wave as the phase-adjusted carrier wave in accordance with the phase information, and also provides, to the input carrier wave, a second delay different from the first delay, and the phase-difference detecting circuit detects a phase difference between the input signal and the carrier wave provided with the second delay.

The phase adjustment circuit preferably further includes a delay circuit for further providing a delay to the delayed carrier wave and outputting the resultant carrier wave as the phase-adjusted carrier wave.

The carrier-wave-delay adjusting circuit preferably further includes: a delay-control-signal generating circuit for generating and outputting a delay control signal for controlling a delay to be provided to the input carrier wave, based on the phase information; and a delay selecting circuit for providing the delay to the input carrier wave and outputting the delayed carrier wave, in accordance with the delay control signal.

The delay-control-signal generating circuit preferably includes: a subtractor for subtracting a first value from the phase information and outputting the result; an integrator for integrating the output from the subtractor and outputting the result; and an adder for adding a second value to the output from the integrator and outputting the result as the delay control signal.

It is preferable that the delay-control-signal generating circuit further includes a multiplier for multiplying the output from the subtractor by a coefficient and outputting the result, and the integrator integrates the output from the multiplier and outputting the result.

The multiplier preferably uses a value input to the multiplier as the coefficient.

It is preferable that the delay-control-signal generating circuit further includes a positive/negative determination circuit for determining whether the output from the subtractor is positive or negative and outputting the result, and the integrator integrates the output from the positive/negative determination circuit and outputs the result.

It is preferable that the delay-control-signal generating circuit further includes: a first multiplier for multiplying the output from the subtractor by a first coefficient and outputting the result; a second multiplier for multiplying the output from the subtractor by a second coefficient and outputting the result; a comparator for comparing the output from the subtractor with the value of a control signal input to the comparator, and outputting the result; and a selector for selecting one of the outputs from the first and second multipliers, in accordance with the output from the comparator, and the integrator integrates the output from the selector and outputs the result.

The delay-control-signal generating circuit preferably includes: a comparator for comparing the phase information with a first value and outputting the result of the comparison; an integrator for integrating the result of the comparison and outputting the result of the integration; and an adder for adding a second value to the output from the integrator and outputting the result as the delay control signal.

The delay selecting circuit preferably includes: a delay circuit for providing a delay to the input carrier wave and generating and outputting a plurality of carrier waves respectively provided with different delays; and a selector for selecting one of the plurality of carrier waves and outputting the selected carrier wave, in accordance with the delay control signal.

According to the present invention, a demodulation circuit includes: a phase adjustment circuit including a carrier-wave-delay adjusting circuit for delaying an input carrier wave and outputting the delayed carrier wave, in accordance with phase information, the carrier-wave-delay adjusting circuit delaying the input carrier wave in such a manner that the delayed carrier wave or a carrier wave generated from the delayed carrier wave is output as a phase-adjusted carrier wave having a phase substantially coincident with a phase of the input signal, and a phase-difference detecting circuit for detecting a phase difference between an input signal and a signal according to the detected carrier wave, and outputting, as the phase information, a value according to the detected phase difference, the phase-difference detecting circuit outputting, as the phase information, a value indicating the presence of a phase difference in a steady state; a multiplier for multiplying the input signal and the phase-adjusted carrier wave together; and a binarization circuit for comparing the result of the multiplication by the multiplier with a threshold value and outputting the result of the comparison.

This demodulation circuit includes a phase adjustment circuit capable of outputting a carrier wave whose phase substantially coincides with the phase of an input signal with stability, so that stable demodulation of the input signal is achieved. In addition, a delay to be provided to the carrier wave is adjusted only in the carrier-wave-delay adjusting circuit, so that the circuit scale is relatively small.

As described above, according to the present invention, a carrier wave whose phase substantially coincides with the phase of an input signal with stability, so that stable demodulation of the input signal is achieved by using the carrier wave. Accordingly, a wobble signal modulated using address information is demodulated to obtain accurate address information.

DESCRIPTION OF THE PREFERRED EMBODIMENTS

Hereinafter, embodiments of the present invention will be described with reference to the drawings.

Embodiment 1

Figure 1:
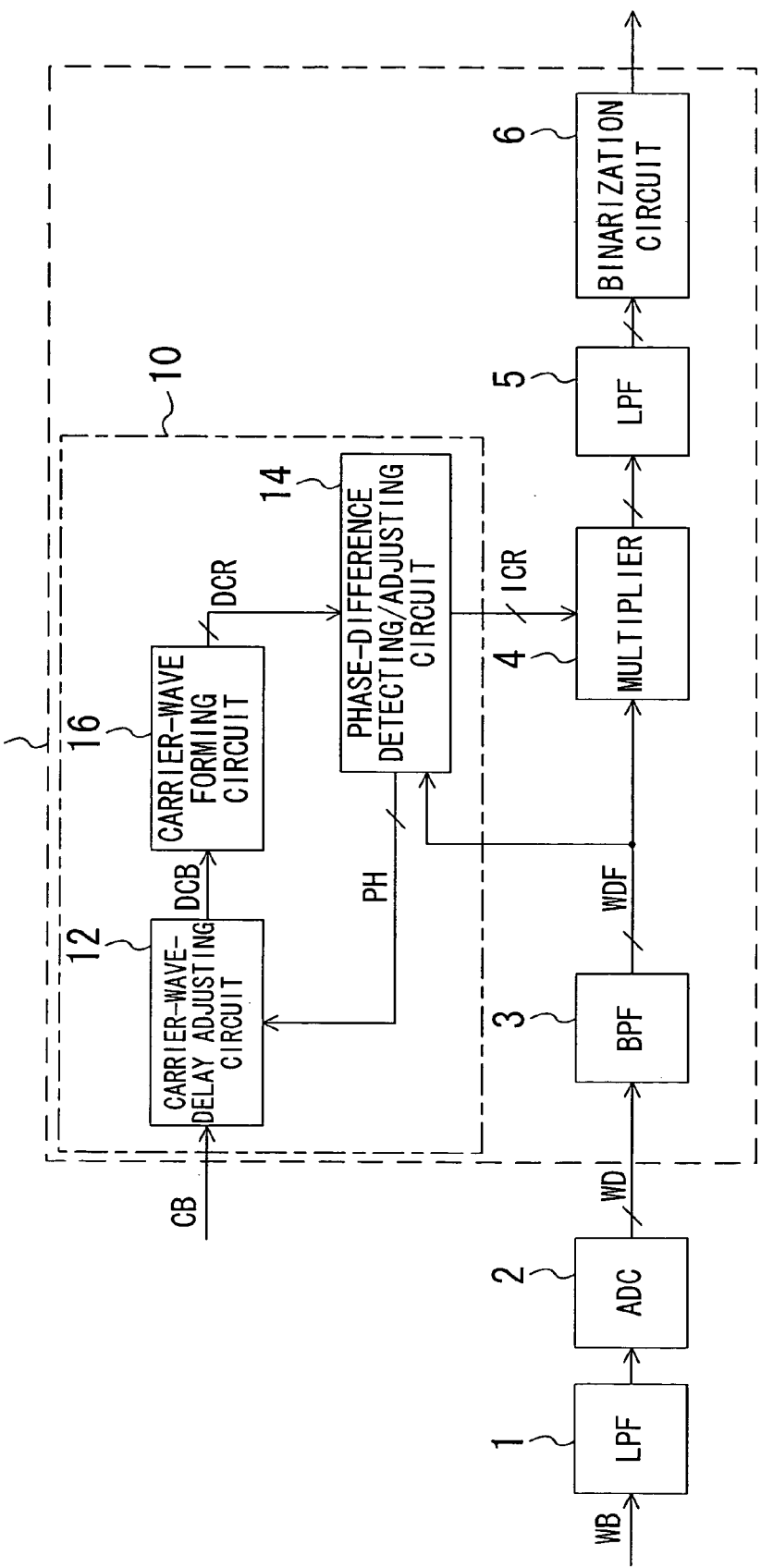
FIG. 1 is a block diagram showing a configuration of a demodulation circuit according to a first embodiment of the present invention.

FIG. 1 is a block diagram showing a configuration of a demodulation circuit according to a first embodiment of the present invention. The circuit shown in FIG. 1 includes: a low-pass filter (LPF) 1; an A/D converter 2; and a demodulation circuit 100. The demodulation circuit 100 includes: a band-pass filter (BPF) 3, a multiplier 4, an LPF 5, a binarization circuit 6 and a phase adjustment circuit 10. The phase adjustment circuit 10 includes: a carrier-wave-delay adjusting circuit 12; a phase-difference detecting/adjusting circuit 14; and a carrier-wave forming circuit 16.

Figure 18:
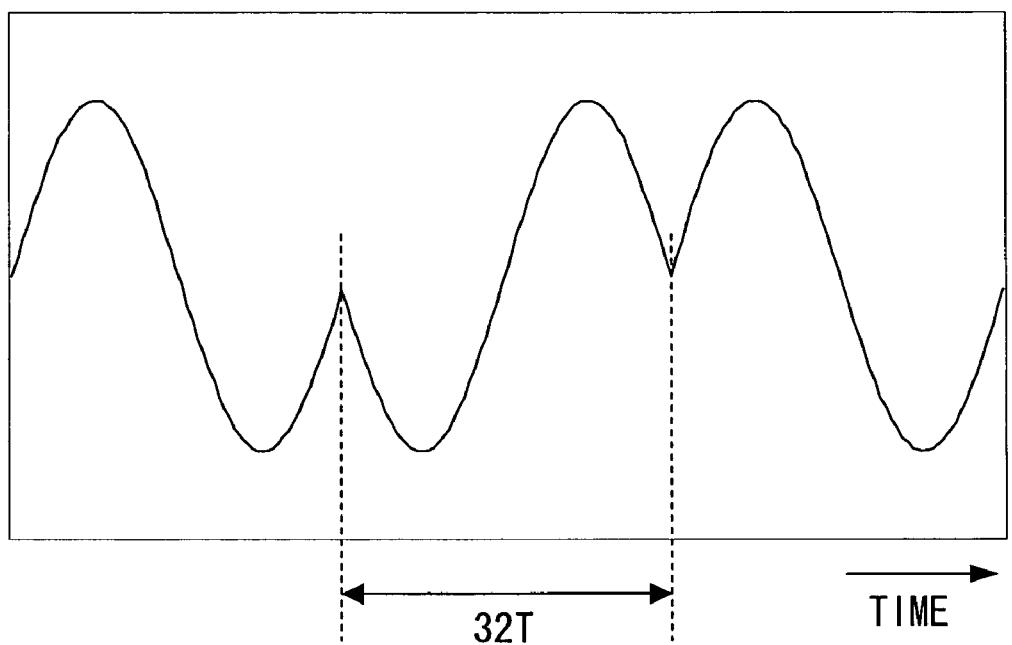
FIG. 18 is a graph showing an example of a waveform of a wobble signal.
Figure 19:
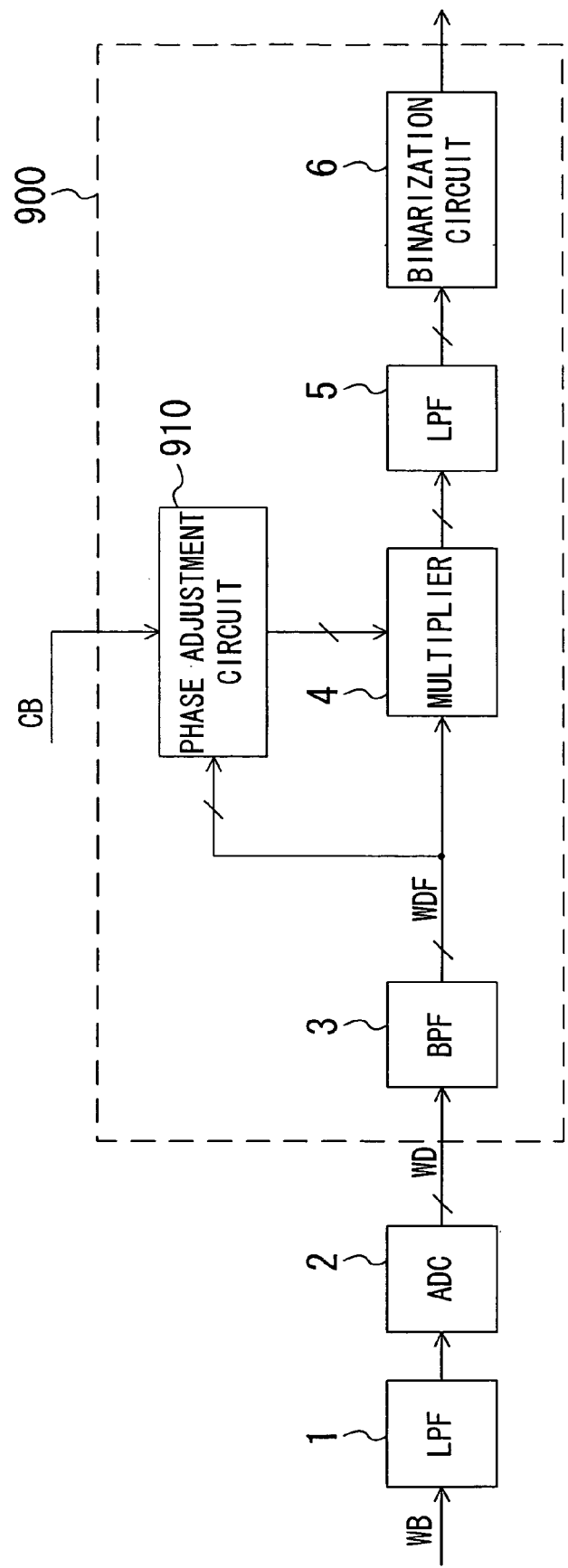
FIG. 19 is a block diagram showing a configuration of a known demodulation circuit.
Figure 20A:
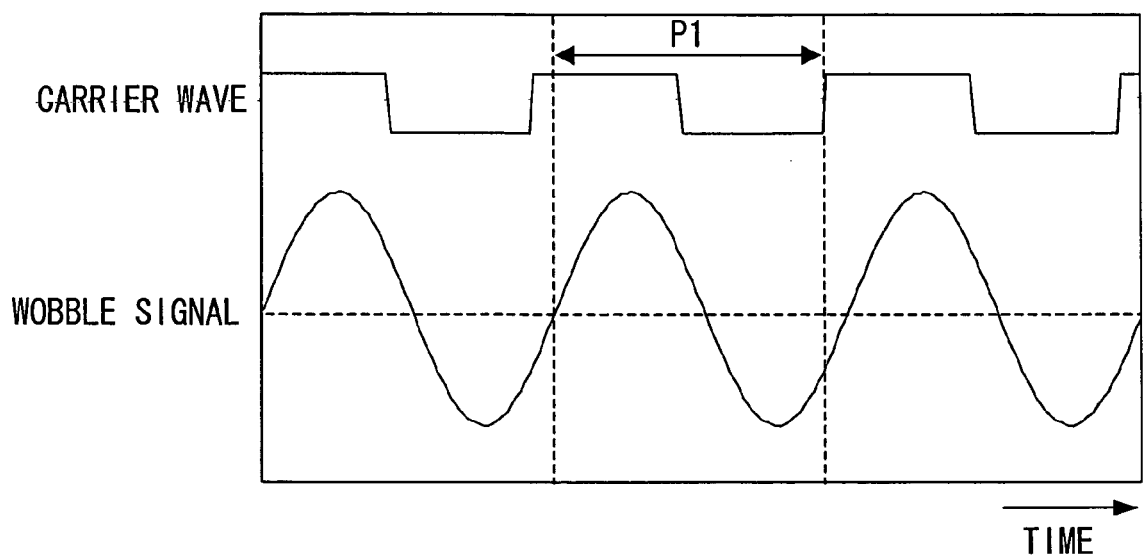
FIG. 20A is a graph showing a relationship between a carrier wave and a wobble signal in a case where the phase of the carrier wave slightly leads the phase of the wobble signal.
Figure 20B:
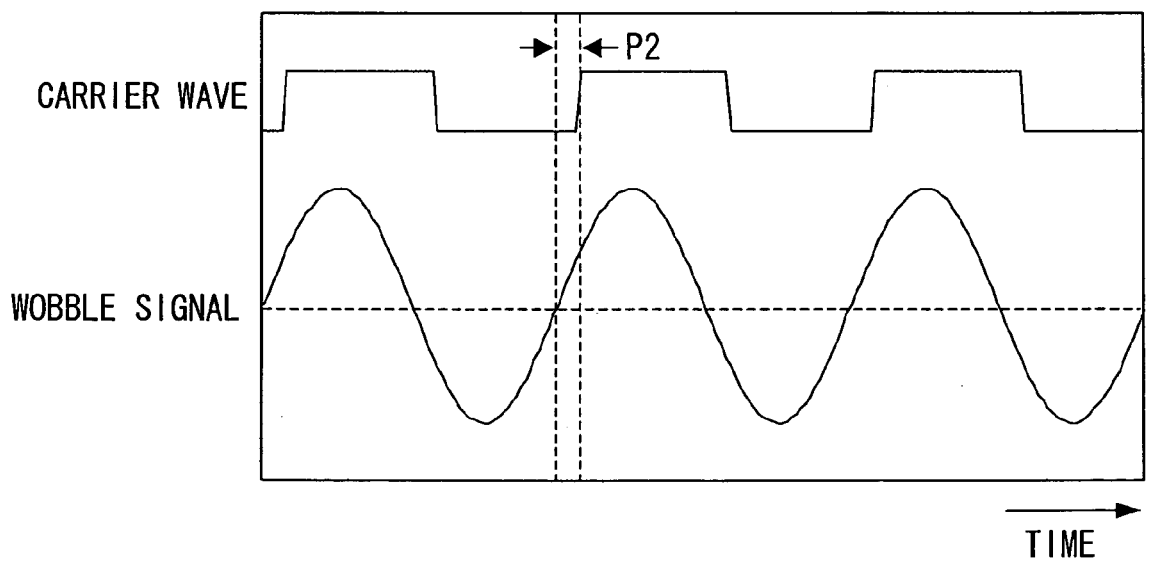
FIG. 20B is a graph showing a relationship between the carrier wave and the wobble signal in a case where the phase of the carrier wave slightly lags behind the phase of the wobble signal.

As an example, the case of using a DVD+R disk and a DVD+RW disk will be described. In this case, as in the case shown in FIG. 18, a wobble signal has a period of 32T (where "T" is a channel clock period) and the frequency of this signal is higher than in the case of using a DVD-R disk or the like. As phase information PH, phase differences of 0 through 31 T will be hereinafter indicated by integers of 0 through 31, respectively. The value of the phase information PH is always zero or positive. For example, as the phase difference decreases, the value of the phase information PH changes in the order of 2, 1, 0, 31, 30, . . . .

An optical pickup (not shown) converts a light beam reflected from the optical disk into an electric signal and outputs the obtained wobble signal WB. The wobble signal WB is modulated using a wobbled groove on which address information is recorded. The wobble signal WB is a signal modulated with a BPSK scheme in accordance with address information. Accordingly, if the wobble signal WB is demodulated, address information is obtained.

The LPF 1 removes noise at high frequencies from the wobble signal WB, which is an analog signal, and outputs the resultant signal. The A/D converter 2 converts the output of the LPF 1 into a digital signal and outputs the digitized wobble signal WD. The BPF 3 further removes noise from the wobble signal WD input from the A/D converter 2 and outputs the resultant wobble signal WDF to the multiplier 4 and the phase-difference detecting/adjusting circuit 14.

The carrier-wave-delay adjusting circuit 12 receives a carrier wave CB having the same period as the wobble signal WB and generated by a phase locked loop (PLL) circuit (not shown). The carrier wave CB is a pulse signal, and thus the value thereof is represented by one bit. The carrier-wave-delay adjusting circuit 12 delays the carrier wave CB in accordance with the phase information PH output from the phase-difference detecting/adjusting circuit 14 and outputs the delayed carrier wave DCB to the carrier-wave forming circuit 16.

The carrier-wave forming circuit 16 converts the carrier wave DCB into a sine wave having the same period as the carrier wave DCB and outputs the resultant carrier wave to the phase-difference detecting/adjusting circuit 14 as a carrier wave DCR. The carrier wave DCR is a signal whose value is represented by multiple bits. The carrier-wave forming circuit 16 may convert the carrier wave DCB into a signal having another waveform such as a triangular wave.

The phase-difference detecting/adjusting circuit 14 detects a phase difference between the wobble signal WDF and the delayed carrier wave DCR and outputs the detected phase difference to the carrier-wave-delay adjusting circuit 12 as the phase information PH. In addition, the phase-difference detecting/adjusting circuit 14 adjusts the delayed carrier wave DCR such that the phase of the delayed carrier wave DCR coincides with the phase of the wobble signal WDF, and outputs a phase-adjusted carrier wave ICR to the multiplier 4.

The multiplier 4 multiplies the wobble signal WDF output from the BPF 3 and the phase-adjusted carrier wave ICR together and outputs the result to the LPF 5. The LPF 5 smoothes the output of the multiplier 4 and outputs the result. The binarization circuit 6 compares the output of the LPF 5 with a threshold value and outputs the result as address information obtained by demodulation.

The phase difference between the delayed carrier wave DCR and the wobble signal WDF corresponds to a half of the period of the carrier wave DCR or the wobble signal WDF, i.e., 16T. Accordingly, in a steady state, the phase-difference detecting/adjusting circuit 14 outputs the value of "16", which indicates the presence of a phase difference of 16T, as the phase information PH.

Figure 2:
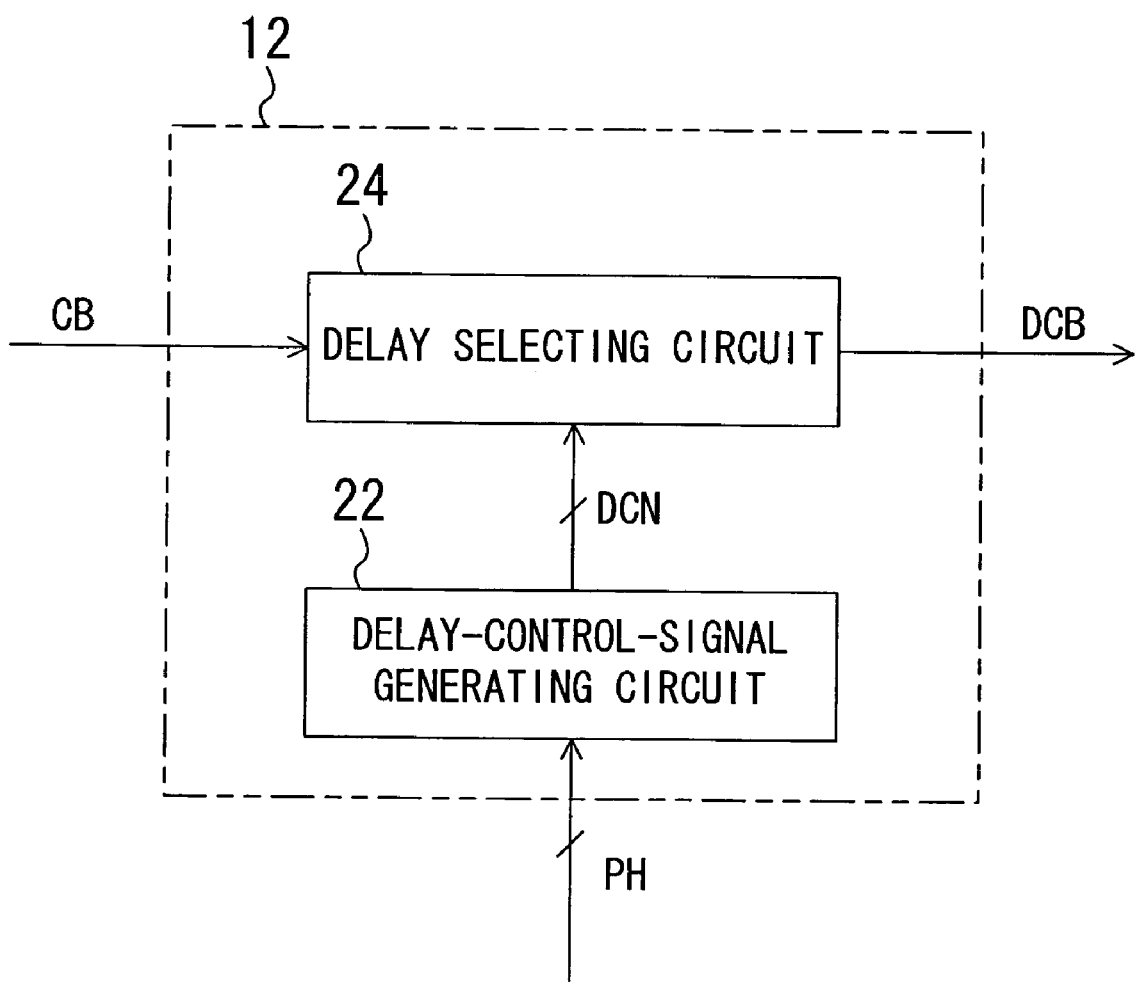
FIG. 2 is a block diagram showing a configuration of a carrier-wave-delay adjusting circuit shown in FIG. 1.

FIG. 2 is a block diagram showing a configuration of the carrier-wave-delay adjusting circuit 12 shown in FIG. 1. The carrier-wave-delay adjusting circuit 12 includes a delay-control-signal generating circuit 22 and a delay selecting circuit 24. The delay-control-signal generating circuit 22 performs operation such as integration on the phase information PH, generates a delay control signal DCN according to the phase information PH and outputs the signal DCN to the delay selecting circuit 24. The delay selecting circuit 24 outputs, as the delayed carrier wave DCB, a signal obtained by adding a delay according to the delay control signal DCN to the received carrier wave CB.

Figure 3:
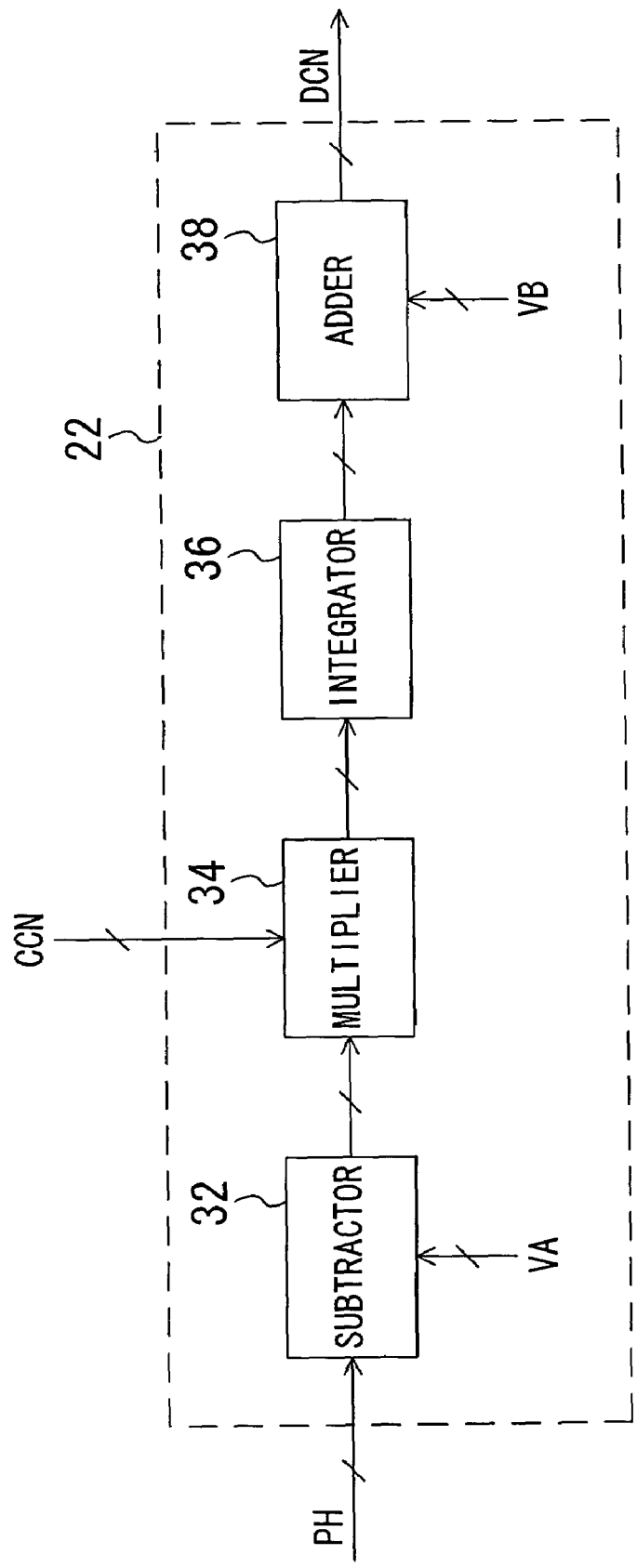
FIG. 3 is a block diagram showing a configuration of a delay-control-signal generating circuit shown in FIG. 2.

FIG. 3 is a block diagram showing a configuration of the delay-control-signal generating circuit 22 shown in FIG. 2. The delay-control-signal generating circuit 22 includes a subtractor 32, a multiplier 34, an integrator 36 and an adder 38.

The subtractor 32 subtracts a reference value VA from the phase information PH and outputs the result. The reference value VA may be a fixed value or may be supplied from a register. In this embodiment, the reference value VA is "16". The multiplier 34 multiplies the output from the subtractor 32 by a coefficient. This coefficient may be a value CCN input to the multiplier 34 or a predetermined value. The integrator 36 integrates the output from the multiplier 34 and outputs the result. The adder 38 adds a reference value VB to the output from the integrator 36 and outputs the result as the delay control signal DCN. In this embodiment, the reference value VB is "16" as the reference value VA.

Figure 4:
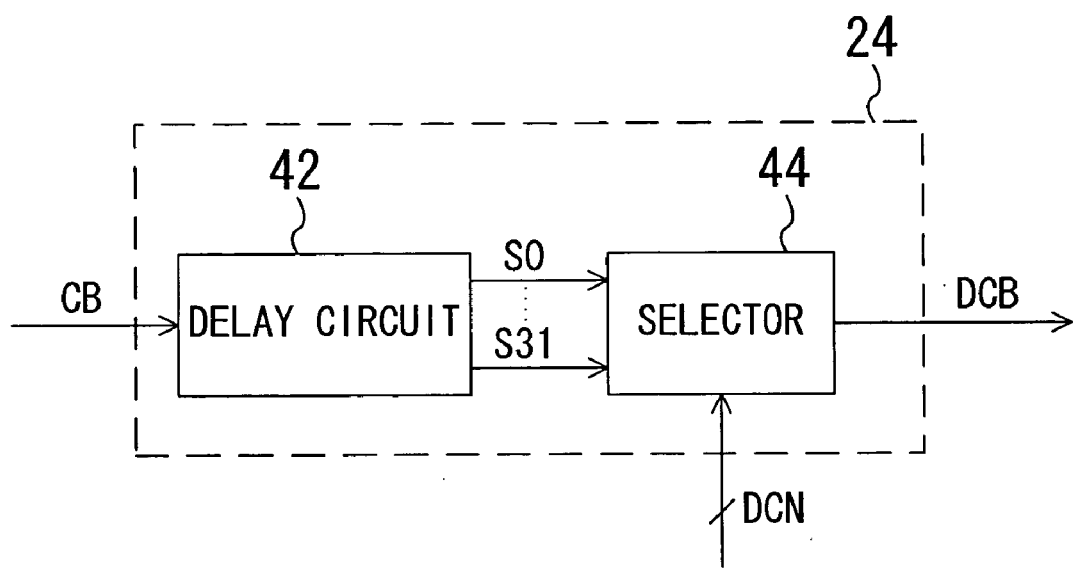
FIG. 4 is a block diagram showing a configuration of a delay selecting circuit shown in FIG. 2.
Figure 5:
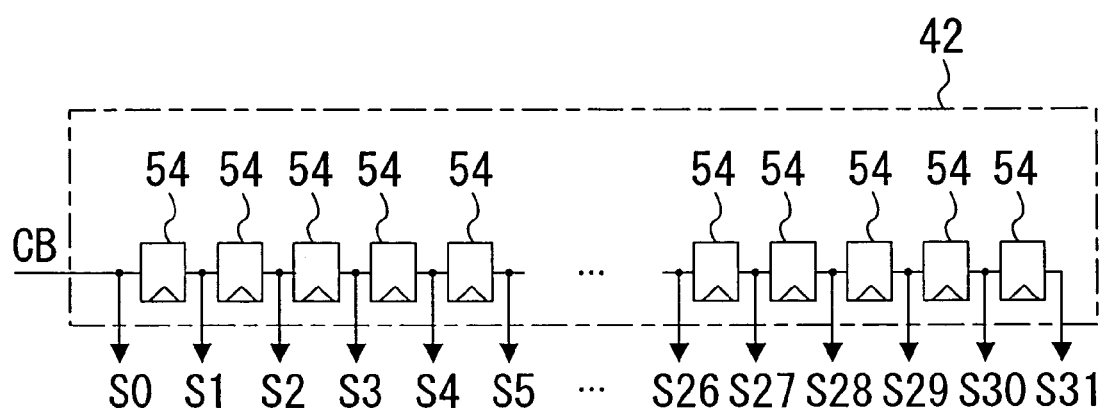
FIG. 5 is a circuit diagram showing a configuration of a delay circuit shown in FIG. 4.

FIG. 4 is a block diagram showing a configuration of the delay selecting circuit 24 shown in FIG. 2. The delay selecting circuit 24 includes a delay circuit 42 and a selector 44. FIG. 5 is a circuit diagram showing a configuration of the delay circuit 42 shown in FIG. 4.

As shown in FIG. 5, the delay circuit 42 is provided with 31 latches 54 connected in series. A channel clock is input to each of the latches 54. Upon every input of the pulse of the clock, each of the latches 54 outputs a value which is currently held, to the latch at the next stage. Accordingly, the delay circuit 42 outputs carrier waves S0 through S31 obtained by respectively adding different delays of 0 through 31 T to the carrier wave CB. The selector 44 shown in FIG. 4 selects one of the carrier waves S0 through S31 in accordance with the delay control signal DCN and outputs the selected carrier wave as the delayed carrier wave DCB.

Supposing the phase-difference detecting/adjusting circuit 14 outputs, as the phase information PH, a delay of the phase of the carrier wave DCR with respect to the wobble signal WDF, if the delay of the carrier wave DCR is large, the value of the delay control signal DCN is also large. Accordingly, the delay selecting circuit 24 is configured to select a carrier wave provided with a smaller delay out of the carrier waves S0 through S31, as the value of the delay control signal DCN increases.

As described above, in the phase adjustment circuit 10 shown in FIG. 1, the value of "16" indicating the presence of a phase difference is output as the phase information PH in a steady state. Accordingly, when the phase difference is always represented by zero or a positive value, the phase difference does not take a value around zero, e.g., "0", and a value close to one period of the carrier wave, e.g., "31", successively. Therefore, the carrier wave ICR whose phase substantially coincides with the phase of the wobble signal WDF is output with stability. As a result, the demodulation circuit 100 demodulates the wobble signal with stability, thus ensuring readout of an address.

Figure 6:
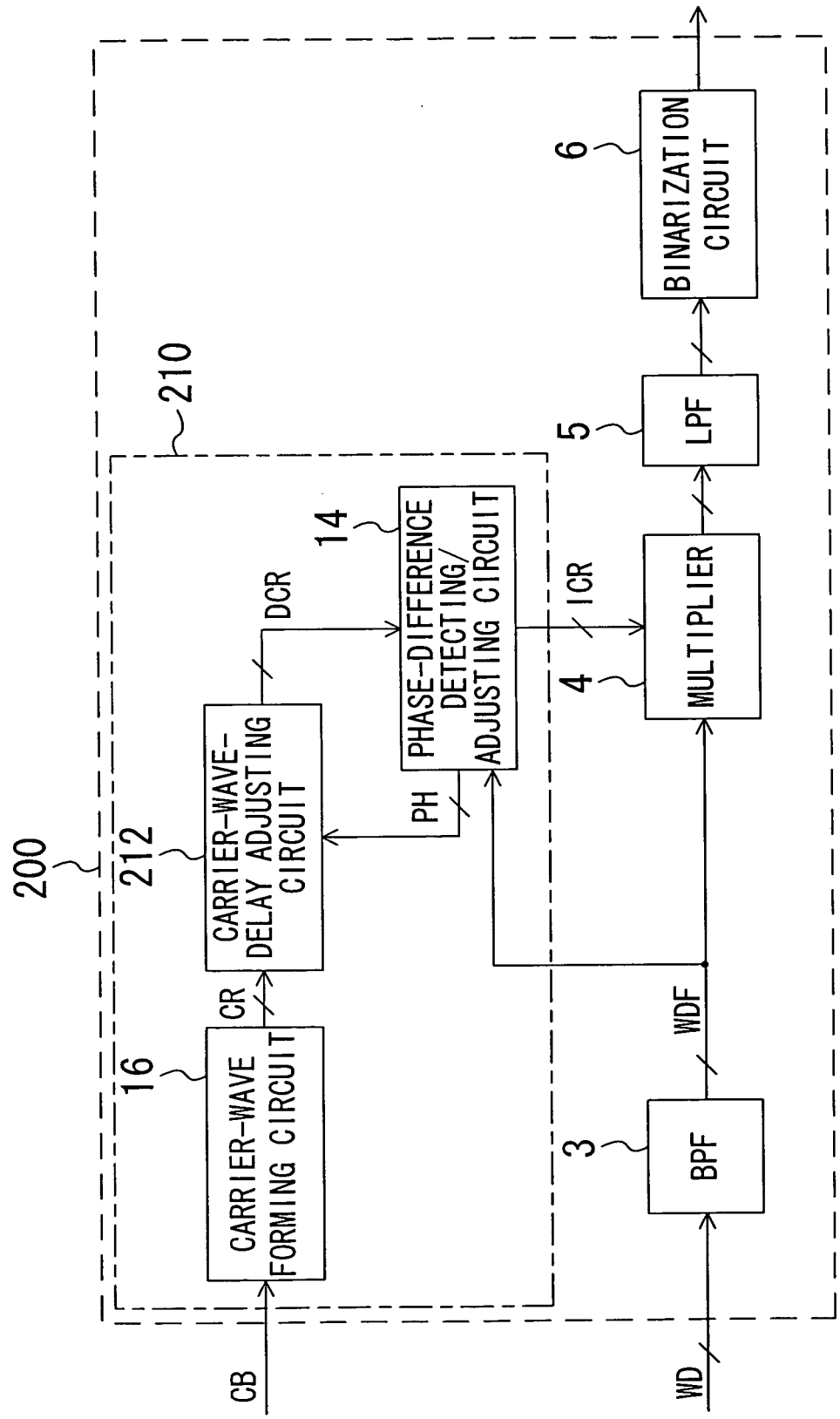
FIG. 6 is a block diagram showing another example of configuration of the demodulation circuit of the first embodiment.

FIG. 6 is a block diagram showing another example of configuration of the demodulation circuit of the first embodiment. A demodulation circuit 200 shown in FIG. 6 includes a phase adjustment circuit 210 instead of the phase adjustment circuit 10 of the demodulation circuit 100 shown in FIG. 1. The phase adjustment circuit 210 includes a carrier-wave-delay adjusting circuit 212, a phase-difference detecting/adjusting circuit 14 and a carrier-wave forming circuit 16.

Though the demodulation circuit 100 shown in FIG. 1 adds a delay to the carrier wave CB and then converts the carrier wave into a sine wave, for example, the demodulation circuit 200 shown in FIG. 6 converts the carrier wave CB into a sine wave, for example, and then adds a delay thereto.

The carrier wave CB having the same period as the wobble signal WB is input to the carrier-wave forming circuit 16. The carrier-wave forming circuit 16 converts this carrier wave CB into a sine wave having the same period as the carrier wave CB and outputs the sine wave to the carrier-wave-delay adjusting circuit 212 as a carrier wave CR. The value of the carrier wave CR is represented by multiple bits. The carrier-wave-delay adjusting circuit 212 delays the carrier wave CR in accordance with phase information PH output from the phase-difference detecting/adjusting circuit 14 and outputs a delayed carrier wave DCR to the phase-difference detecting/adjusting circuit 14. The other aspects are the same as in the demodulation circuit shown in FIG. 1, and thus description thereof will be omitted.

The carrier-wave-delay adjusting circuit 212 is configured substantially in the same manner as the carrier-wave-delay adjusting circuit 12 shown in FIG. 1, but includes a delay selection circuit capable of delaying the carrier wave CR represented by multiple bits and outputting the delayed carrier wave, instead of the delay selecting circuit 24 shown in FIG. 2. Specifically, the delay selection circuit of the carrier-wave-delay adjusting circuit 212 needs to include, instead of the delay circuit 42 shown in FIG. 5, a delay circuit in which a plurality of circuits similar to the delay circuit 42 are connected in parallel and also to include, instead of the selector 44 shown in FIG. 4, a selector for selecting one signal out of a plurality of signals represented by multiple bits.

In this manner, the demodulation circuit 200 shown in FIG. 6 also demodulates a wobble signal with stability and ensures readout of an address, as the demodulation circuit 100 shown in FIG. 1. However, since the numbers of bits of the carrier waves processed by the carrier-wave-delay adjusting circuits in these demodulation circuits are different from each other, the demodulation circuit 100 shown in FIG. 1 achieves a smaller circuit scale than the demodulation circuit 200 shown in FIG. 6.

Figure 7:
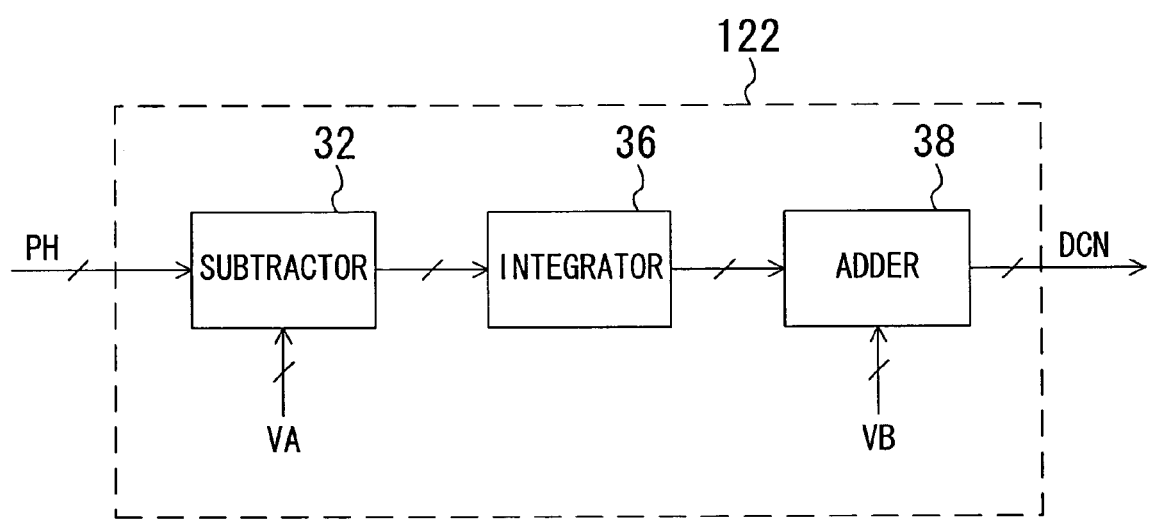
FIG. 7 is a block diagram showing another example of configuration of the delay-control-signal generating circuit shown in FIG. 2.

FIG. 7 is a block diagram showing another example of configuration of the delay-control-signal generating circuit shown in FIG. 2. A delay-control-signal generating circuit 122 shown in FIG. 7 is similar to the delay-control-signal generating circuit 22 shown in FIG. 3 but the multiplier 34 is omitted therein. If the time constant for control does not need to be set to detail, the delay-control-signal generating circuit 122 as shown in FIG. 7 may be used.

Figure 8:
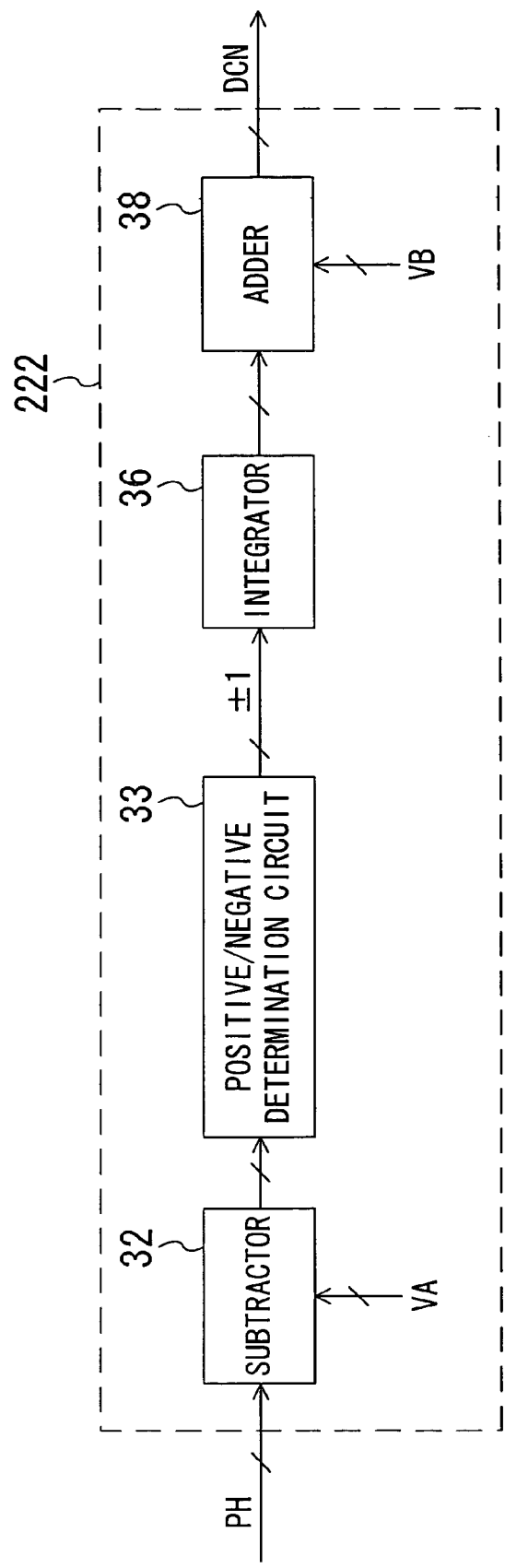
FIG. 8 is a block diagram showing another example of configuration of the delay-control-signal generating circuit shown in FIG. 2.

FIG. 8 is a block diagram showing another example of configuration of the delay-control-signal generating circuit shown in FIG. 2. A delay-control-signal generating circuit 222 shown in FIG. 8 is similar to the delay-control-signal generating circuit 22 shown in FIG. 3 but a positive/negative determination circuit 33 is provided instead of the multiplier 34. The positive/negative determination circuit 33 determines whether the output of the subtractor 32 is positive or negative, and outputs the determination result to the integrator 36. Specifically, the positive/negative determination circuit 33 outputs "1" if the output of the subtractor 32 is positive, outputs "0" if the output is zero, and outputs "−1" in the other case. Use of the positive/negative determination circuit 33 allows a reduction of the circuit scale as compared to the case of using the multiplier 34.

Figure 9:
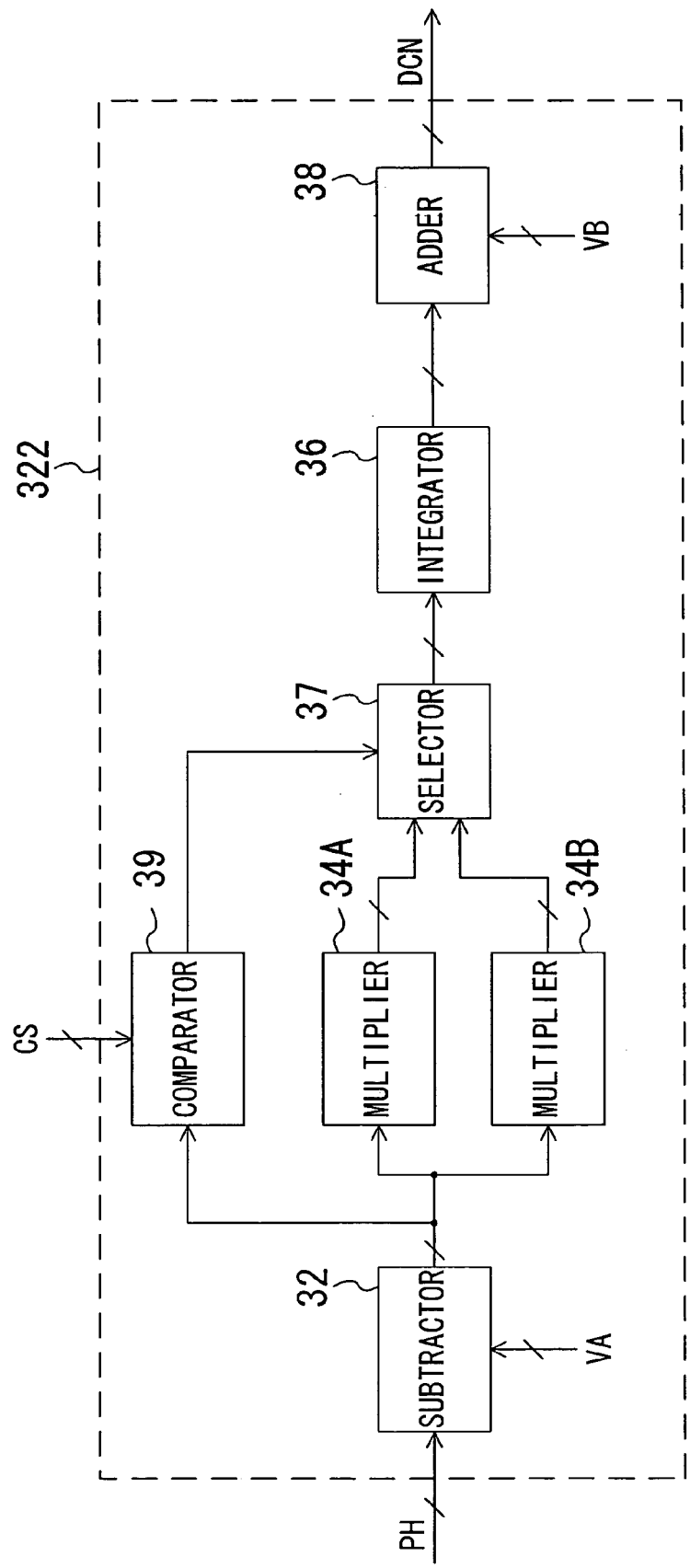
FIG. 9 is a block diagram showing another example of configuration of the delay-control-signal generating circuit shown in FIG. 2.

FIG. 9 is a block diagram showing another example of configuration of the delay-control-signal generating circuit shown in FIG. 2. A delay-control-signal generating circuit 322 shown in FIG. 9 is similar to the delay-control-signal generating circuit 22 shown in FIG. 3 but is different in that first and second multipliers 34A and 34B, a selector 37 and a comparator 39 are provided instead of the multiplier 34.

The multipliers 34A and 34B hold different coefficients. In this example, it is assumed that the coefficient held by the multiplier 34A is larger than that held by the multiplier 34B. Each of the multipliers 34A and 34B multiplies the output of the subtractor 32 by its coefficient and outputs the result to the selector 37. The comparator 39 compares the output of the subtractor 32 with the value of a control signal CS input from the outside of the delay-control-signal generating circuit 322, and outputs the result to the selector 37. The selector 37 selects one of the outputs from the multipliers 34A and 34B in accordance with the output of the comparator 39 and outputs the selected output to the integrator 36.

The value of the output of the subtractor 32 is large at the beginning of control and then gradually approaches zero. Therefore, if the output of the subtractor 32 is larger than the control signal CS, the selector 37 selects the output of the multiplier 34A while otherwise selecting the output of the multiplier 34B. Then, the control quickly approaches a steady state and, after the control has approached the steady state, the control is carried out with stability.

Figure 10:
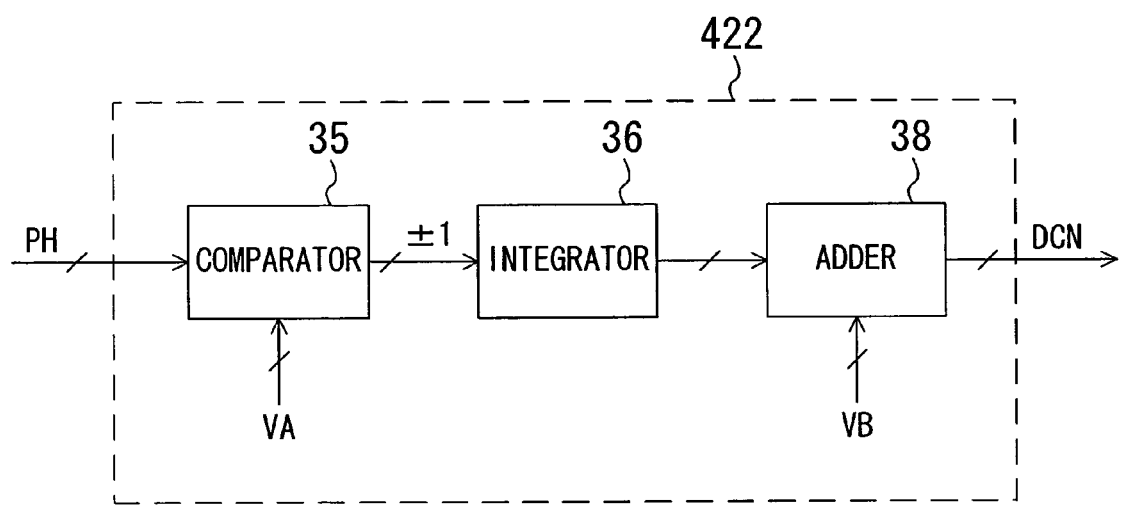
FIG. 10 is a block diagram showing another example of configuration of the delay-control-signal generating circuit shown in FIG. 2.

FIG. 10 is a block diagram showing another example of configuration of the delay-control-signal generating circuit shown in FIG. 2. The delay-control-signal generating circuit 422 shown in FIG. 10 is similar to the delay-control-signal generating circuit 122 shown in FIG. 7 but is different in that a comparator 35 is provided instead of the subtractor 32. The comparator 35 compares the value of the input phase information PH with the reference value VA, and outputs "1" if the value of the phase information PH is larger, "0" if these values are equal to each other and "−1" in the other case, to the integrator 36. Use of the comparator 35 allows a reduction of the circuit scale as compared to the case of using the subtractor 32.

Figure 11:
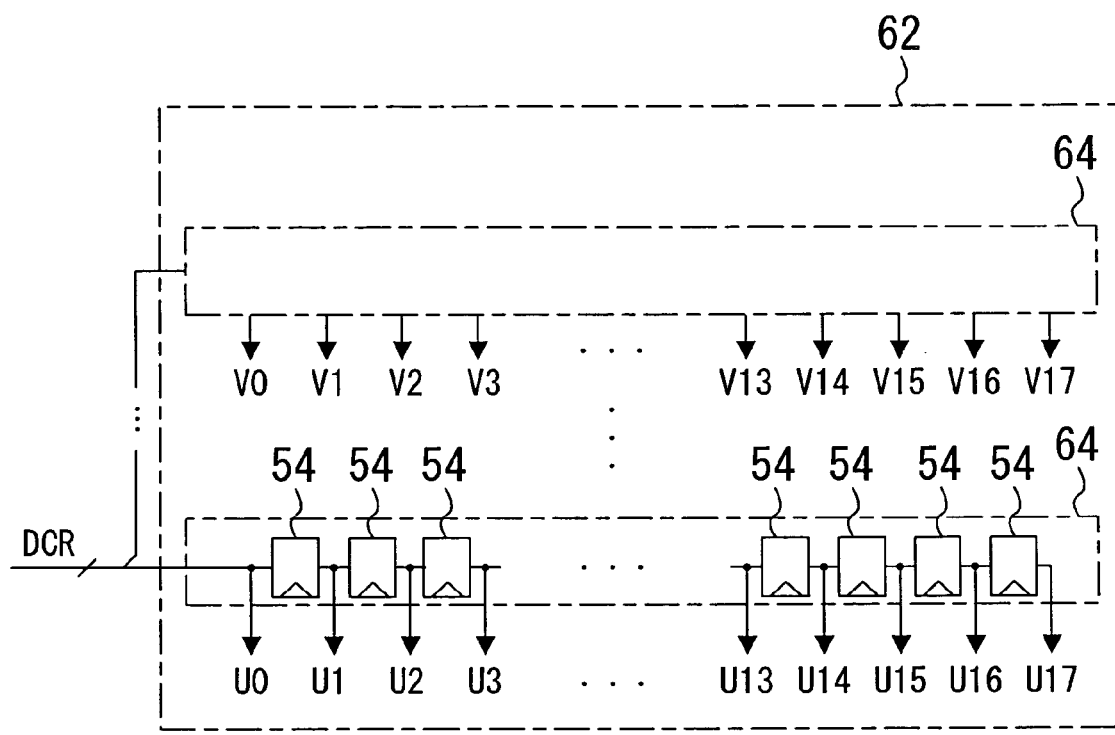
FIG. 11 is a circuit diagram showing a delay circuit included in a phase-difference detecting/adjusting circuit shown in FIG. 1.

FIG. 11 is a circuit diagram showing a delay circuit 62 included in the phase-difference detecting/adjusting circuit 14 shown in FIG. 1. The phase-difference detecting/adjusting circuit 14 includes the delay circuit 62 as shown in FIG. 11, which further delays the delayed carrier wave DCR and outputs the resultant carrier waves. The delay circuit 62 includes a plurality of circuits 64 in each of which latches 54 are connected in series. The circuit 64 is similar to the delay circuit 42 but is different in that the number of the latches 54 in each of the circuits 64 is smaller than that that in the delay circuit 42 and is, for example, 17.

The bits of the carrier wave DCR are input to the respective circuits 64, and each of the bits is output to the latch 54 at the next stage in synchronization with a channel clock. Signals U0 through U17 are signals having delays of 0 through 17T, respectively, with respect to the carrier wave DCR. In the same way, signals V0 through V17 are signals having delays of 0 through 17T, respectively, with respect to the carrier wave DCR. Out of these signals, a plurality of signals having the same delay (e.g., the signals U16, V16 and other like signals) constitute one carrier wave. Accordingly, the delay circuit 62 outputs a plurality of carrier waves obtained by respectively adding different delays of 0 through 17T to the carrier wave DCR. The phase-difference detecting/adjusting circuit 14 selects one of these carrier waves whose phase substantially coincides with the phase of the wobble signal WDF and outputs the selected carrier wave as the carrier wave ICR.

The demodulation circuit 100 shown in FIG. 1 performs control such that the phase difference between the carrier wave DCR and the wobble signal WDF is a half of the period of the carrier wave DCR or the wobble signal WDF (i.e., 16T). Accordingly, when the control comes into a steady state, the phase-difference detecting/adjusting circuit 14 selects the signals U16, V16 and other like signals output by way of the 16 latches 54 and outputs the selected signals. Therefore, the phase-difference detecting/adjusting circuit 14 does not need to provide a delay of 31T at the maximum to the carrier wave, unlike the delay selecting circuit 24, as long as it is possible to add a delay which is smaller than 31T but is about 16T to the carrier wave.

That is, it is sufficient for the phase-difference detecting/adjusting circuit 14 to include the latches 54 in a number slightly larger than 16 for each of the bits of the carrier wave DCR. Though the delay circuit 42 shown in FIG. 5 includes the 31 latches 54, the number of the latches 54 provided in the phase-difference detecting/adjusting circuit 14 is not necessarily 31. In other words, it is sufficient that the number of the latches 54 provided in the phase-difference detecting/adjusting circuit 14 is smaller than the number (31 in this embodiment) which is one smaller than the number required to produce a delay corresponding to one period of the carrier wave DCR or the wobble signal WDF. Instead of latches, registers each for storing multiple bits may be used.

Embodiment 2

Figure 12:
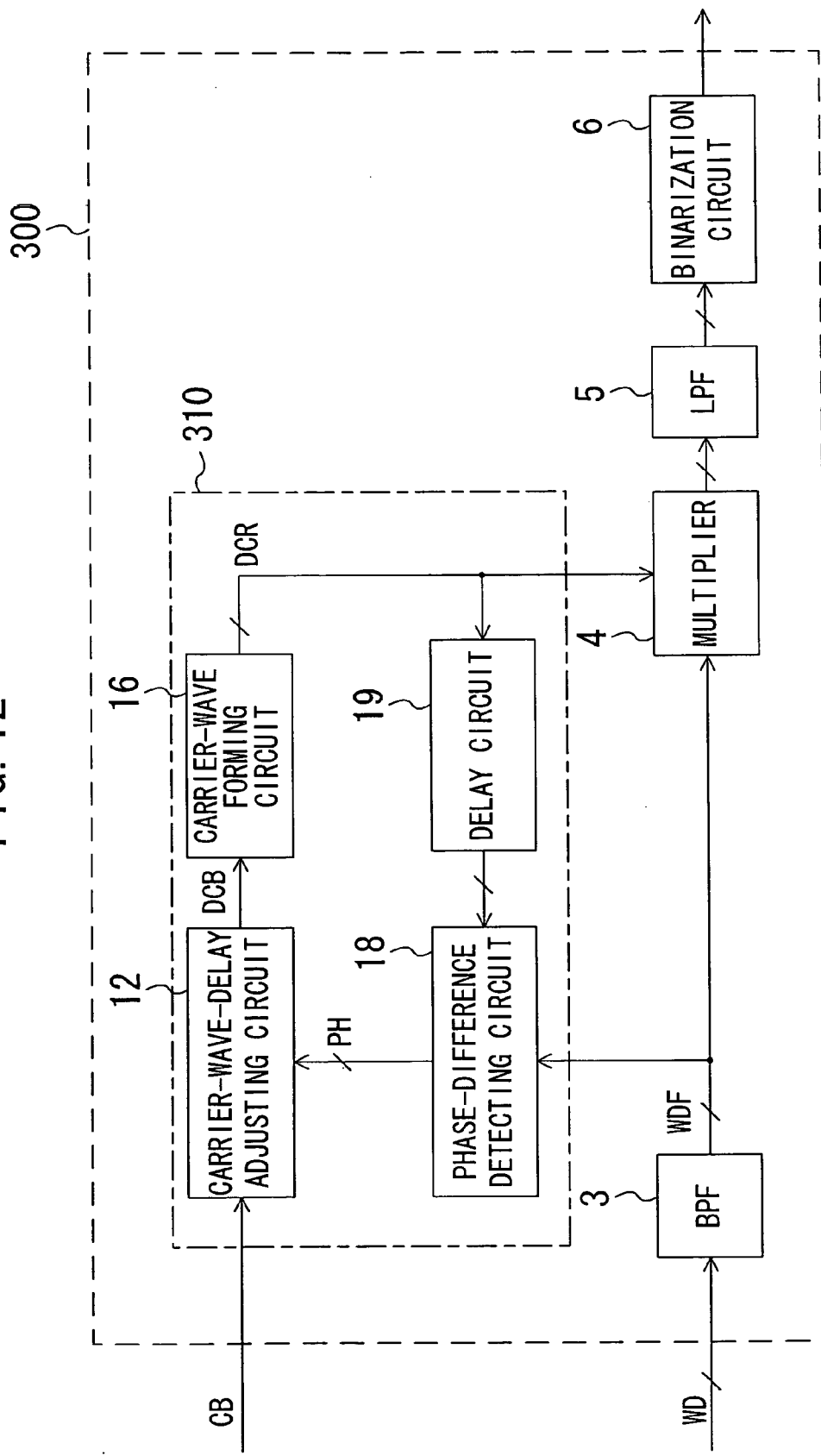
FIG. 12 is a block diagram showing a configuration of a demodulation circuit according to a second embodiment of the present invention.

FIG. 12 is a block diagram showing a configuration of a demodulation circuit according to a second embodiment of the present invention. A demodulation circuit 300 shown in FIG. 12 is similar to the demodulation circuit 100 shown in FIG. 1 but is different in that a phase adjustment circuit 310 is provided instead of the phase adjustment circuit 10. The phase adjustment circuit 310 includes: a carrier-wave-delay adjusting circuit 12; a carrier-wave forming circuit 16; a phase-difference detecting circuit 18; and a delay circuit 19.

As in the demodulation circuit 100 shown in FIG. 1, a wobble signal WD is input to a BPF 3 by way of an LPF 1 and an A/D converter 2. The BPF 3 further removes noise from the wobble signal WD and outputs the resultant wobble signal WDF to a multiplier 4 and the phase-difference detecting circuit 18. The carrier-wave-delay adjusting circuit 12 and the carrier-wave forming circuit 16 are the same as those described with reference to FIG. 1.

The carrier-wave-delay adjusting circuit 12 delays a carrier wave CB in accordance with phase information PH and outputs the delayed carrier wave DCB to the carrier-wave forming circuit 16. At this time, in consideration of a delay occurring in the carrier-wave forming circuit 16, the carrier-wave-delay adjusting circuit 12 delays the carrier wave CB in such a manner that the carrier-wave forming circuit 16 generates the carrier wave DCR whose phase coincides with the phase of the wobble signal WDF based on the delayed carrier wave DCB. The carrier-wave forming circuit 16 outputs the generated carrier wave DCR to the multiplier 4 and the delay circuit 19, as a phase-adjusted carrier wave.

The delay circuit 19 adds a delay (i.e., 16T) which is a half of the period of the wobble signal WD to the carrier wave DCR output from the carrier-wave forming circuit 16, and outputs the delayed carrier wave to the phase-difference detecting circuit 18. The phase-difference detecting circuit 18 detects a phase difference between the wobble signal WDF output from the BPF 3 and the output of the delay circuit 19 based on the rising edge of the output of the delay circuit 19, and outputs the detected phase difference to the carrier-wave-delay adjusting circuit 12 as the phase information PH. The phase information PH has a value in the range from zero to 31.

In a steady state, the carrier wave DCR and the wobble signal WDF need to have the same phase. Therefore, the phase difference between the output of the delay circuit 19 and the wobble signal WDF is controlled to approach a half of the period of the wobble signal WD, i.e., 16T. Accordingly, in the steady state, the phase-difference detecting circuit 18 outputs a value of "16" as the phase information PH.

The reference value VA used in the delay-control-signal generating circuit 22 shown in FIG. 3 is the value of the phase information PH output from the phase-difference detecting circuit 18 in the steady state and is "16" in the carrier-wave-delay adjusting circuit 12 shown in FIG. 12. The reference value VB is the value of a delay control signal DCN which allows the carrier wave DCR output from the carrier-wave forming circuit 16 to have the same phase as the wobble signal WDF in the steady state.

In the demodulation circuit shown in FIG. 1, each of the carrier-wave-delay adjusting circuit 12 and the phase-difference detecting/adjusting circuit 14 generates a plurality of carrier waves with different delays, and one of these carrier waves is selected. On the other hand, in the demodulation circuit shown in FIG. 12, only the carrier-wave-delay adjusting circuit 12 performs such generation of a plurality of carrier waves and selection. Accordingly, the demodulation circuit shown in FIG. 12 reduces the numbers of latches, resistors and other components, resulting in a reduction of the circuit scale.

MODIFIED EXAMPLE 1 OF EMBODIMENT 2

Figure 13:
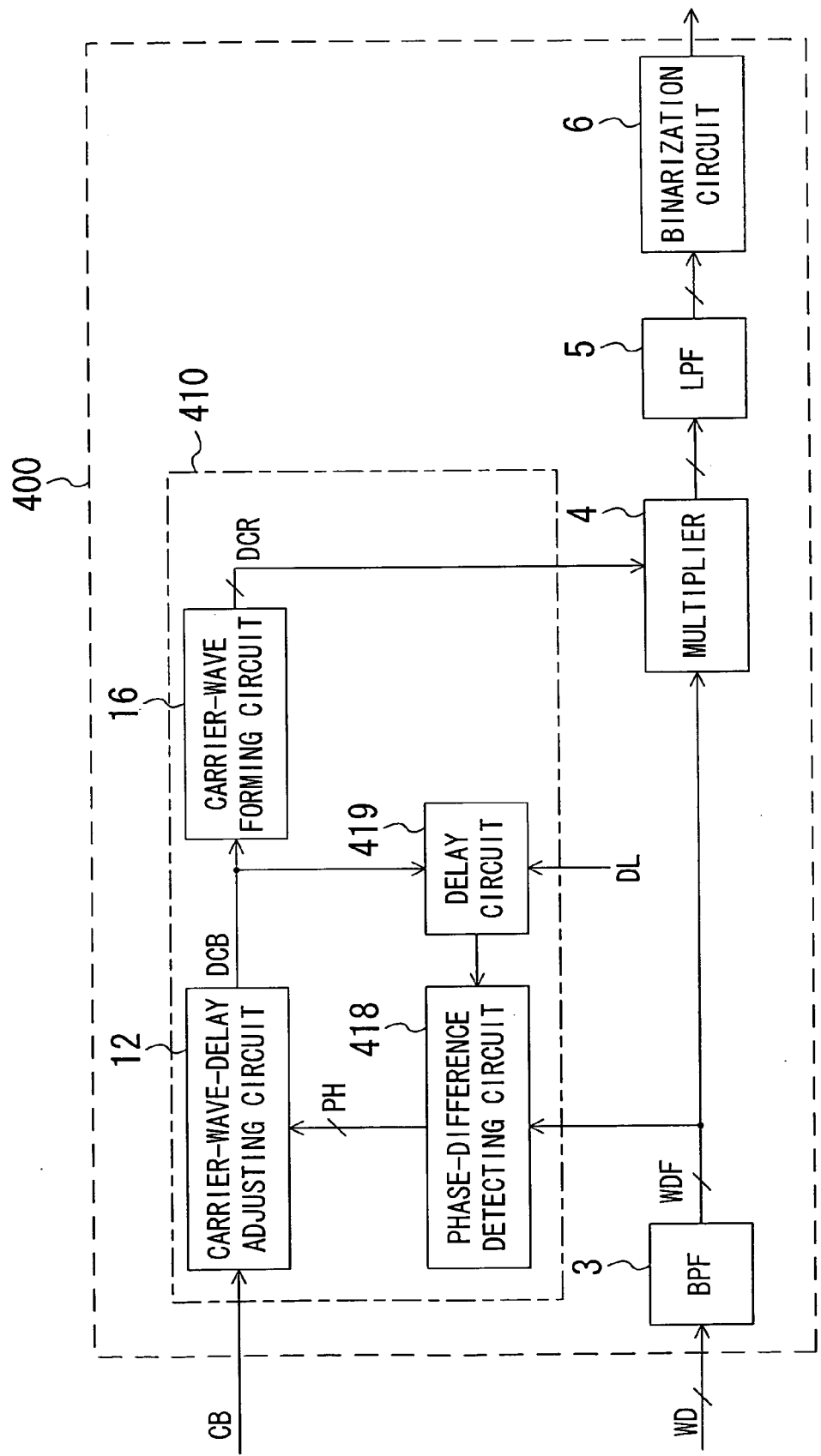
FIG. 13 is a block diagram showing a configuration of a demodulation circuit according to a first modified example of the second embodiment.

FIG. 13 is a block diagram showing a configuration of a demodulation circuit according to a first modified example of the second embodiment. A demodulation circuit 400 shown in FIG. 13 is similar to the demodulation circuit 300 shown in FIG. 12 but is different in that a phase adjustment circuit 410 is provided instead of the phase adjustment circuit 310. The phase adjustment circuit 410 includes a phase-difference detecting circuit 418 and a delay circuit 419 instead of the phase-difference detecting circuit 18 and the delay circuit 19, respectively, of the phase adjustment circuit 310 shown in FIG. 12.

The delay circuit 419 does not receive the carrier wave DCR output from the carrier-wave forming circuit 16 but receives the carrier wave DCB output from the carrier-wave-delay adjusting circuit 12, adds a predetermined delay to the received carrier wave and outputs the resultant carrier wave to the phase-difference detecting circuit 418. As the phase-difference detecting circuit 18 shown in FIG. 12, the phase-difference detecting circuit 418 detects a phase difference between the wobble signal WDF output from the BPF 3 and the output from the delay circuit 419, and outputs the detected phase difference to the carrier-wave-delay adjusting circuit 12 as phase information PH Supposing the delay provided by the delay circuit 419 is the same as that provided by the delay circuit 19, the value of the phase information PH in a steady state decreases by a delay occurring in the carrier-wave forming circuit 16.

The delay circuit 419 receives a delay control signal DL and adds a delay according to this signal to the carrier wave DCB. Accordingly, the value of the phase information PH is controlled using the delay control signal DL, to be a value other than zero in the steady state as intended.

It is sufficient that the delay circuit 419 is configured to delay the carrier wave DCB represented by one bit, so that the circuit scale thereof is smaller than the delay circuit 19 that delays the carrier wave DCR represented by multiple bits.

MODIFIED EXAMPLE 2 OF EMBODIMENT 2

Figure 14:
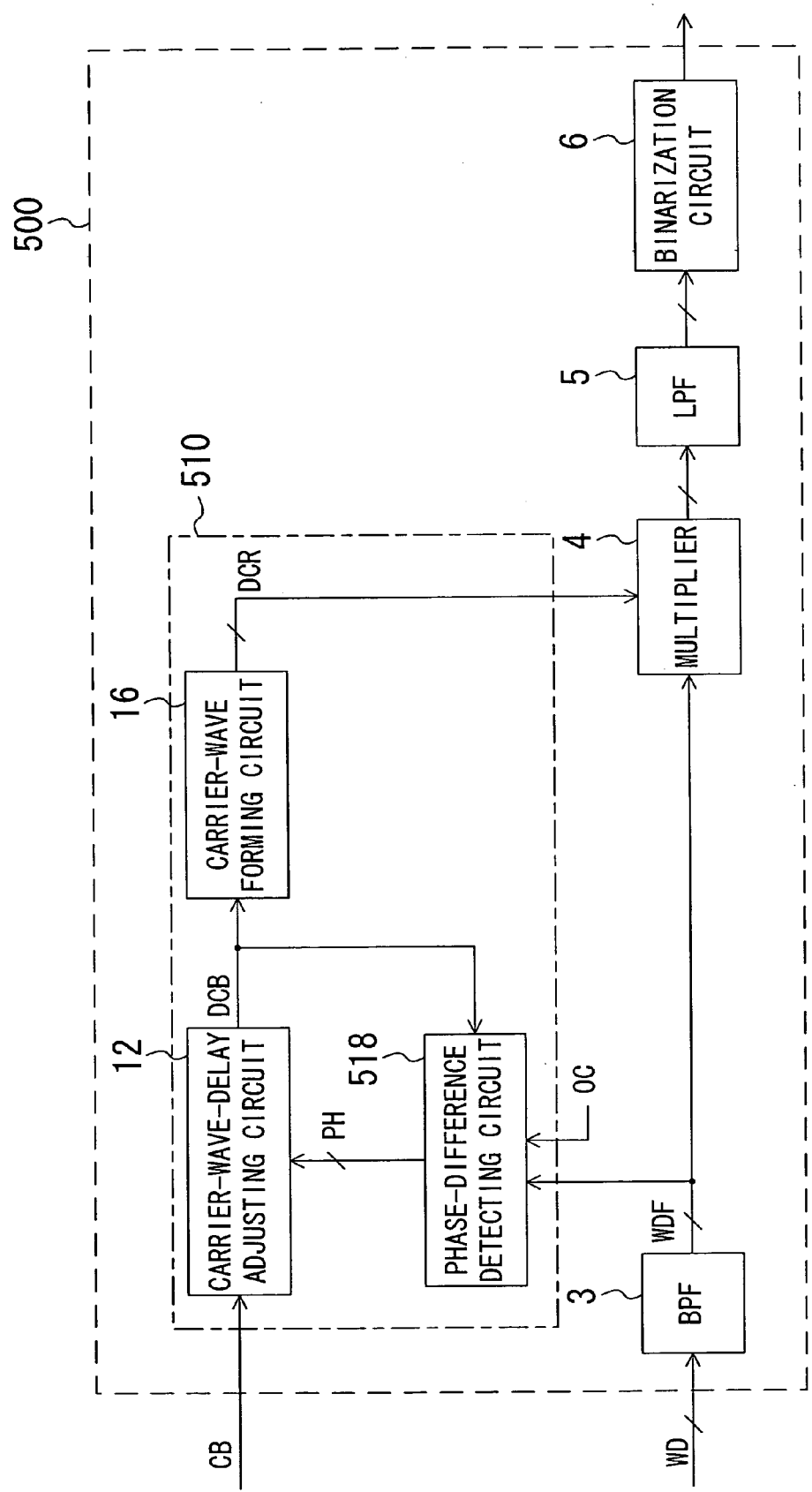
FIG. 14 is a block diagram showing a configuration of a demodulation circuit according to a second modified example of the second embodiment.

FIG. 14 is a block diagram showing a configuration of a demodulation circuit according to a second modified example of the second embodiment. A demodulation circuit 500 shown in FIG. 14 is similar to the demodulation circuit 400 shown in FIG. 13 but is different in that a phase adjustment circuit 510 is provided instead of the phase adjustment circuit 410. The phase adjustment circuit 510 includes a phase-difference detecting circuit 518 instead of the phase-difference detecting circuit 418 of the phase adjustment circuit 410 shown in FIG. 13 and does not include the delay circuit 419.

An offset control signal OC is input to the phase-difference detecting circuit 518. The phase-difference detecting circuit 518 detects a phase difference between the wobble signal WDF and a carrier wave DCB output from the carrier-wave-delay adjusting circuit 12, adds a value according to the offset control signal OC to the detected phase difference and outputs the obtained value to the carrier-wave-delay adjusting circuit 12 as phase information PH. The offset signal OC is a signal which allows the phase information PH to have a value of 16 in a steady state.

The demodulation circuit 500 shown in FIG. 14 does not need the delay circuit 419, and thus the circuit scale thereof is smaller than that of the demodulation circuit 400 shown in FIG. 13. In addition, since the delay circuit 419 is not included in the control loop, control exhibits a quick response and the phase of a carrier wave DCR comes to coincide with that of the wobble signal WDF in a shorter time.

MODIFIED EXAMPLE 3 OF EMBODIMENT 2

Figure 15:
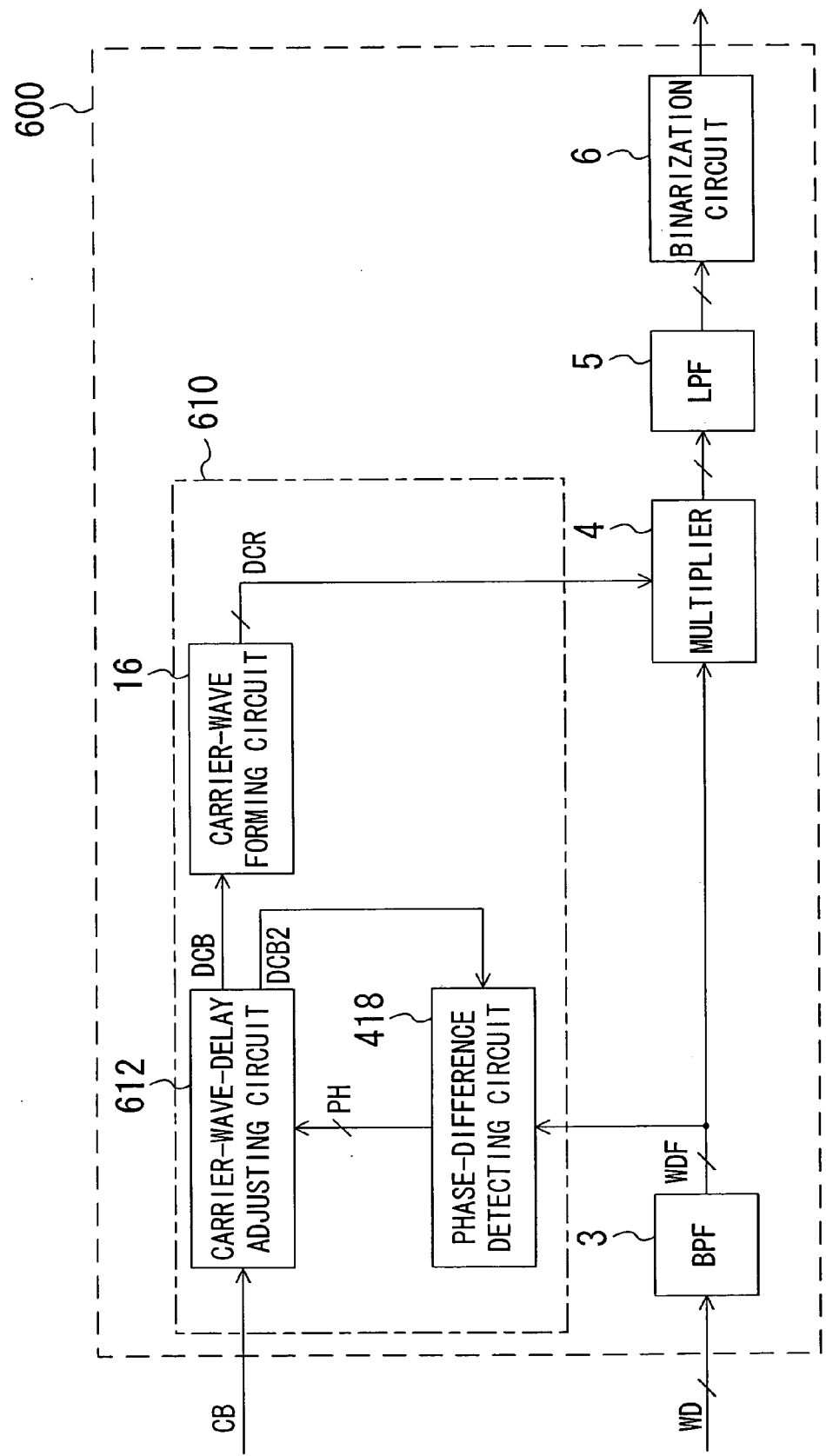
FIG. 15 is a block diagram showing a configuration of a demodulation circuit according to a third modified example of the second embodiment.

FIG. 15 is a block diagram showing a configuration of a demodulation circuit according to a third modified example of the second embodiment. A demodulation circuit 600 shown in FIG. 15 is similar to the demodulation circuit 400 shown in FIG. 13 but is different in that a phase adjustment circuit 610 is provided instead of the phase adjustment circuit 410. The phase adjustment circuit 610 includes a carrier-wave-delay adjusting circuit 612 instead of the carrier-wave-delay adjusting circuit 12 of the phase adjustment circuit 410 shown in FIG. 13 and does not include the delay circuit 419.

As the carrier-wave-delay adjusting circuit 12, the carrier-wave-delay adjusting circuit 612 outputs a carrier wave DCB to a carrier-wave forming circuit 16 and also outputs a carrier wave DCB 2 with a delay which is different from that of the carrier wave DCB to a phase-difference detecting circuit 418. The carrier wave DCB 2 is a signal having a phase difference of 16T from the carrier wave DCR, in consideration of a delay occurring in the carrier-wave forming circuit 16. The phase difference between the carrier wave DCB 2 and the carrier wave DCB is constant.

Since the demodulation circuit 600 shown in FIG. 15 does not need the delay circuit 419, the circuit scale thereof is smaller than that of the demodulation circuit 400 shown in FIG. 13.

MODIFIED EXAMPLE 4 OF EMBODIMENT 2

Figure 16:
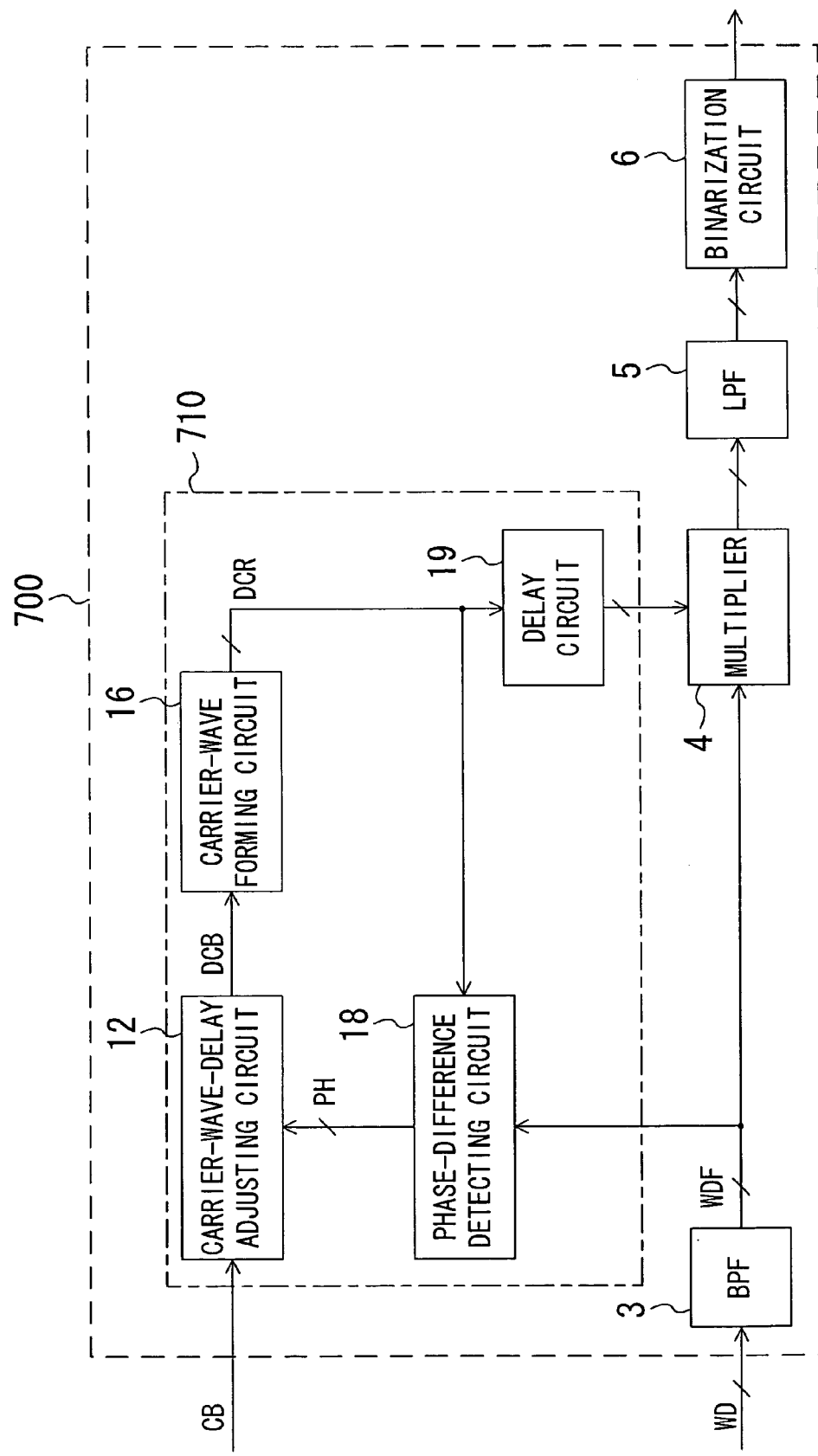
FIG. 16 is a block diagram showing a configuration of a demodulation circuit according to a fourth modified example of the second embodiment.

FIG. 16 is a block diagram showing a configuration of a demodulation circuit according to a fourth modified example of the second embodiment. A demodulation circuit 700 shown in FIG. 16 is similar to the demodulation circuit 300 shown in FIG. 12 but is different in that a phase adjustment circuit 710 is provided instead of the phase adjustment circuit 310. In the phase adjustment circuit 710, the output from a delay circuit 19 is supplied not to a phase-difference detecting circuit 18 but the multiplier 4 and the output from a carrier-wave forming circuit 16 is supplied to the phase-difference detecting circuit 18, unlike the phase adjustment circuit 310 shown in FIG. 12.

The phase adjustment circuit 710 performs control such that the phase difference between a carrier wave DCR output from the carrier-wave forming circuit 16 and the wobble signal WDF is 16T. In the demodulation circuit 700 shown in FIG. 16, the delay circuit 19 is provided outside the control loop, so that the control exhibits a quick response and the phase of the carrier wave output from the delay circuit 19 comes to coincide with the phase of the wobble signal WDF in a shorter time.

The reference value VB provided to the adder 38 shown in FIG. 3 may be changed. In such a case, the delay added to a carrier wave DCB output from the carrier-wave-delay adjusting circuit 12 is changed, thereby controlling the delay of the carrier wave input to the multiplier 4.

If the delay added to the carrier wave DCR by the delay circuit 19 is changed in accordance with the reference value VB, it is possible to change the delays provided in the carrier-wave-delay adjusting circuit 12 and the delay circuit 19 while maintaining the phase coincidence between the carrier wave provided to the multiplier 4 and the wobble signal WDF.

MODIFIED EXAMPLE 5 OF EMBODIMENT 2

Figure 17:
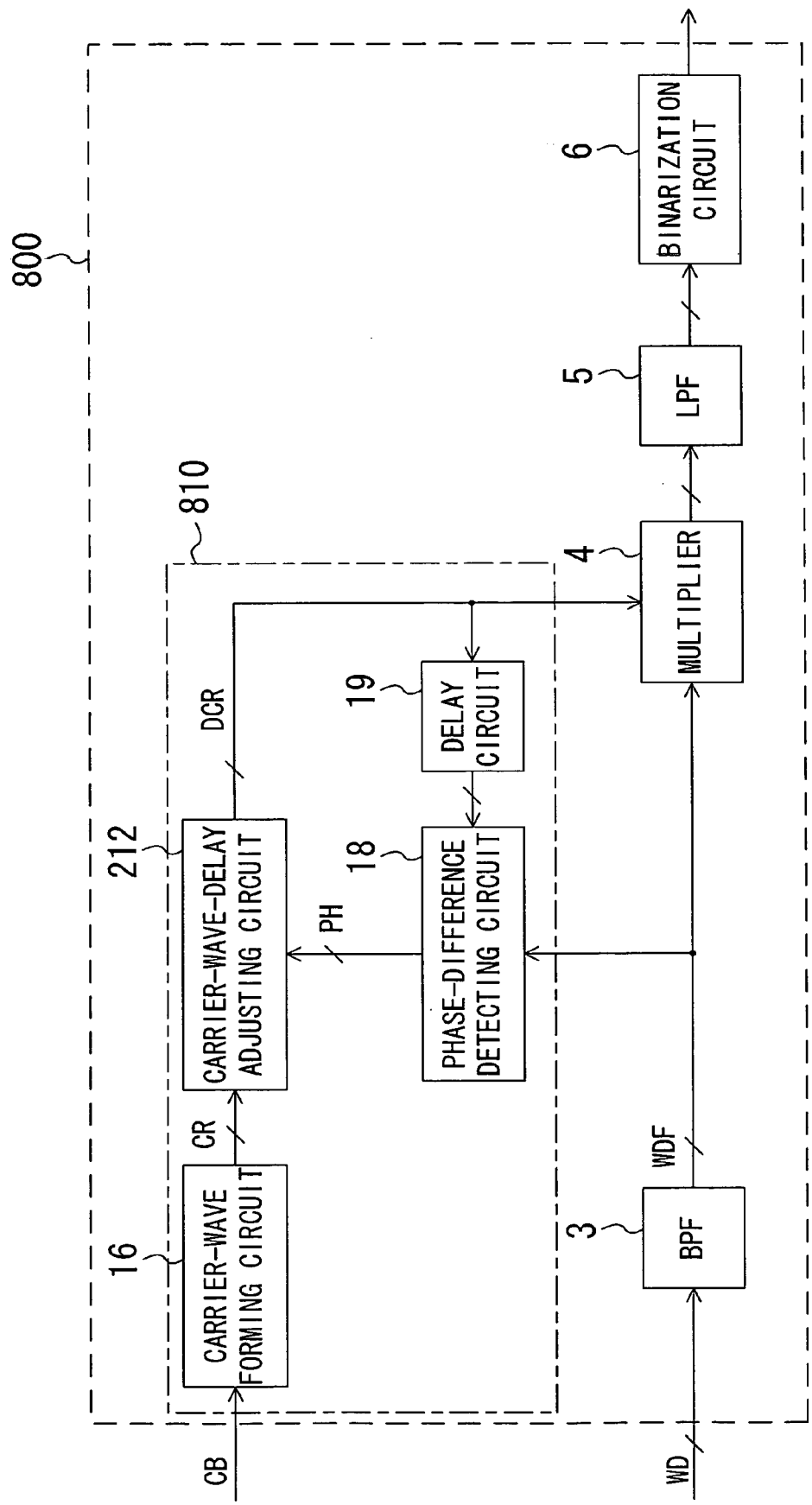
FIG. 17 is a block diagram showing a configuration of a demodulation circuit according to a fifth modified example of the second embodiment.

FIG. 17 is a block diagram showing a configuration of a demodulation circuit according to a fifth modified example of the second embodiment. A demodulation circuit 800 shown in FIG. 17 is similar to the demodulation circuit 300 shown in FIG. 12 but is different in that a phase adjustment circuit 810 is provided instead of the phase adjustment circuit 310. The phase adjustment circuit 810 includes a carrier-wave-delay adjusting circuit 212 instead of the carrier-wave-delay adjusting circuit 12 of the phase adjustment circuit 310 shown in FIG. 12.

Though the demodulation circuit 300 shown in FIG. 12 adds a delay to the carrier wave CB and then converts the carrier wave into a wave with a different waveform such as a sine wave, the demodulation circuit 800 shown in FIG. 17 is different from the demodulation circuit 300 in that the carrier wave CB is converted into, for example, a sine wave, and then a delay is added thereto.

The carrier-wave forming circuit 16 and the carrier-wave-delay adjusting circuit 212 are the same as those described with reference to FIG. 6 except that the carrier-wave-delay adjusting circuit 212 outputs the delayed carrier wave DCR to the delay circuit 19 and the multiplier 4 as a phase-adjusted carrier wave. The other aspects are the same as those of the demodulation circuit 300 shown in FIG. 12, and the detailed description thereof will be omitted.

In this manner, as the demodulation circuit 300 shown in FIG. 12, the demodulation circuit 800 shown in FIG. 17 also demodulates a wobble signal with stability and ensures readout of an address. However, since the numbers of bits of the carrier waves processed by the carrier-wave-delay adjusting circuits in these demodulation circuits are different from each other, the demodulation circuit 300 shown in FIG. 12 achieves a smaller circuit scale than the demodulation circuit 800 shown in FIG. 17.

In each of the demodulation circuits shown in FIGS. 12 through 17, the carrier-wave-delay adjusting circuit 12 or 212 provided with the delay-control-signal generating circuit 22 shown in FIG. 3 is used. Instead of the delay-control-signal generating circuit 22, a carrier-wave-delay adjusting circuit including one of the delay-control-signal generating circuits 122, 222, 322 and 422 shown in FIGS. 7 through 10 may be used.

The foregoing description has been given mainly on a case where control is carried out when the value of the phase information PH output from the phase-difference detecting/adjusting circuit 14 or the phase-difference detecting circuit 18 is 16 in a steady state. Alternatively, a value other than zero may be output as the phase information PH in the steady state.

In the foregoing embodiments, the carrier-wave forming circuit 16 may be omitted. In such a case, the multiplier 4 multiplies the carrier wave DCB or DCR output from the carrier-wave-delay adjusting circuit 12 or 212 and the wobble signal WDF together.

In the phase adjustment circuit and the demodulation circuit according to the present invention, a wobble signal modulated in accordance with address information is demodulated and address information is obtained accurately. Therefore, the inventive phase adjustment circuit and demodulation circuit are useful for recording/reproducing devices for optical disks with wobbled grooves on which address information is recorded.

What is claimed is:

1. A phase adjustment circuit, comprising:
   a carrier-wave-delay adjusting circuit for delaying an input carrier wave and outputting the delayed carrier wave, in accordance with phase information; and
   a phase-difference detecting/adjusting circuit for detecting a phase difference between an input signal and the delayed carrier wave, outputting, as the phase information, a value according to the detected phase difference, adjusting the delayed carrier wave such that the delayed carrier wave has a phase substantially coincident with a phase of the input signal, and outputting the resultant carrier wave as a phase-adjusted carrier wave,
   wherein in a steady state, the phase-difference detecting/adjusting circuit outputs, as the phase information, a value indicating the presence of a phase difference.

2. The phase adjustment circuit of claim 1, further comprising a carrier-wave forming circuit for converting the delayed carrier wave into a carrier wave with a different waveform and outputting the resultant carrier wave, wherein the phase-difference detecting/adjusting circuit performs processing using the output from the carrier-wave forming circuit.

3. The phase adjustment circuit of claim 1, further comprising a carrier-wave forming circuit for converting an input carrier wave into a carrier wave with a different waveform and outputting the resultant carrier wave,
wherein the carrier-wave-delay adjusting circuit performs processing using the output from the carrier-wave forming circuit.

4. The phase adjustment circuit of claim 1, wherein the carrier-wave-delay adjusting circuit includes:
a delay-control-signal generating circuit for generating and outputting a delay control signal for controlling a delay to be provided to the input carrier wave, based on the phase information; and
a delay selecting circuit for providing the delay to the input carrier wave and outputting the delayed carrier wave, in accordance with the delay control signal.

5. The phase adjustment circuit of claim 4, wherein the delay-control-signal generating circuit includes:
a subtractor for subtracting a first value from the phase information and outputting the result;
an integrator for integrating the output from the subtractor and outputting the result; and
an adder for adding a second value to the output from the integrator and outputting the result as the delay control signal.

6. The phase adjustment circuit of claim 5, wherein the delay-control-signal generating circuit further includes a multiplier for multiplying the output from the subtractor by a coefficient and outputting the result, and
the integrator integrates the output from the multiplier and outputting the result.

7. The phase adjustment circuit of claim 6, wherein the multiplier uses a value input to the multiplier as the coefficient.

8. The phase adjustment circuit of claim 5, wherein the delay-control-signal generating circuit further includes a positive/negative determination circuit for determining whether the output from the subtractor is positive or negative and outputting the result, and
the integrator integrates the output from the positive/negative determination circuit and outputs the result.

9. The phase adjustment circuit of claim 5, wherein the delay-control-signal generating circuit further includes:
a first multiplier for multiplying the output from the subtractor by a first coefficient and outputting the result;
a second multiplier for multiplying the output from the subtractor by a second coefficient and outputting the result;
a comparator for comparing the output from the subtractor with the value of a control signal input to the comparator, and outputting the result; and
a selector for selecting one of the outputs from the first and second multipliers, in accordance with the output from the comparator, and
the integrator integrates the output from the selector and outputs the result.

10. The phase adjustment circuit of claim 4, wherein the delay-control-signal generating circuit includes:
a comparator for comparing the phase information with a first value and outputting the result of the comparison;
an integrator for integrating the result of the comparison and outputting the result of the integration; and
an adder for adding a second value to the output from the integrator and outputting the result as the delay control signal.

11. The phase adjustment circuit of claim 4, wherein the delay selecting circuit includes:
a delay circuit for providing a delay to the input carrier wave and generating and outputting a plurality of carrier waves respectively provided with different delays; and
a selector for selecting one of the plurality of carrier waves and outputting the selected carrier wave, in accordance with the delay control signal.

12. The phase adjustment circuit of claim 11, wherein the phase-difference detecting/adjusting circuit provides a delay to the delayed carrier wave, generates a plurality of carrier waves respectively provided with different delays, selects one of the plurality of carrier waves and outputs the selected carrier wave as the phase-adjusted carrier wave, and
the maximum value of the delays provided by the phase-difference detecting/adjusting circuit is smaller than the maximum value of the delays provided by the delay selecting circuit.

13. A demodulation circuit, comprising:
a phase adjustment circuit including
a carrier-wave-delay adjusting circuit for delaying an input carrier wave and outputting the delayed carrier wave, in accordance with phase information, and
a phase-difference detecting/adjusting circuit for detecting a phase difference between an input signal and the delayed carrier wave, outputting, as the phase information, a value according to the detected phase difference, adjusting the delayed carrier wave such that the delayed carrier wave has a phase substantially coincident with a phase of the input signal, and outputting the resultant carrier wave as a phase-adjusted carrier wave, the phase-difference detecting/adjusting circuit outputting, as the phase information, a value indicating the presence of a phase difference in a steady state;
a multiplier for multiplying the input signal and the phase-adjusted carrier wave together; and
a binarization circuit for comparing the result of the multiplication by the multiplier with a threshold value and outputting the result of the comparison.

14. A phase adjustment circuit, comprising:
a carrier-wave-delay adjusting circuit for delaying an input carrier wave and outputting the delayed carrier wave, in accordance with phase information; and
a phase-difference detecting circuit for detecting a phase difference between an input signal and a signal according to the delayed carrier wave, and outputting, as the phase information, a value according to the detected phase difference,
wherein in a steady state, the phase-difference detecting circuit outputs, as the phase information, a value indicating the presence of a phase difference, and
the carrier-wave-delay adjusting circuit delays the input carrier wave in such a manner that the delayed carrier wave or a carrier wave generated from the delayed carrier wave is output as a phase-adjusted carrier wave having a phase substantially coincident with a phase of the input signal.

15. The phase adjustment circuit of claim 14, further comprising a carrier-wave forming circuit for converting the delayed carrier wave into a carrier wave with a different waveform and outputting the resultant carrier wave as the phase-adjusted carrier wave.

16. The phase adjustment circuit of claim 14, further comprising a carrier-wave forming circuit for converting an input carrier wave into a carrier wave with a different waveform and outputting the resultant carrier wave,
　　wherein the carrier-wave-delay adjusting circuit performs processing using the output from the carrier-wave forming circuit and outputs the delayed carrier wave as the phase-adjusted carrier wave.

17. The phase adjustment circuit of claim 14, further comprising a delay circuit for further providing a delay to the delayed carrier wave and outputting the resultant carrier wave,
　　wherein the phase-difference detecting circuit detects a phase difference between the input signal and the output from the delay circuit.

18. The phase adjustment circuit of claim 17, wherein the delay circuit is configured to control the amount of the delay to be provided to the delayed carrier wave.

19. The phase adjustment circuit of claim 14, wherein the phase-difference detecting circuit adds an offset to the detected phase difference and outputs the result as the phase information.

20. The phase adjustment circuit of claim 14, wherein the carrier-wave-delay adjusting circuit provides a first delay to the input carrier wave to output the resultant carrier wave as the phase-adjusted carrier wave in accordance with the phase information, and also provides, to the input carrier wave, a second delay different from the first delay, and
　　the phase-difference detecting circuit detects a phase difference between the input signal and the carrier wave provided with the second delay.

21. The phase adjustment circuit of claim 14, further comprising a delay circuit for further providing a delay to the delayed carrier wave and outputting the resultant carrier wave as the phase-adjusted carrier wave.

22. The phase adjustment circuit of claim 14, wherein the carrier-wave-delay adjusting circuit further includes:
　　a delay-control-signal generating circuit for generating and outputting a delay control signal for controlling a delay to be provided to the input carrier wave, based on the phase information; and
　　a delay selecting circuit for providing the delay to the input carrier wave and outputting the delayed carrier wave, in accordance with the delay control signal.

23. The phase adjustment circuit of claim 22, wherein the delay-control-signal generating circuit includes:
　　a subtractor for subtracting a first value from the phase information and outputting the result;
　　an integrator for integrating the output from the subtractor and outputting the result; and
　　an adder for adding a second value to the output from the integrator and outputting the result as the delay control signal.

24. The phase adjustment circuit of claim 23, wherein the delay-control-signal generating circuit further includes a multiplier for multiplying the output from the subtractor by a coefficient and outputting the result, and
　　the integrator integrates the output from the multiplier and outputting the result.

25. The phase adjustment circuit of claim 24, wherein the multiplier uses a value input to the multiplier as the coefficient.

26. The phase adjustment circuit of claim 23, wherein the delay-control-signal generating circuit further includes a positive/negative determination circuit for determining whether the output from the subtractor is positive or negative and outputting the result, and
　　the integrator integrates the output from the positive/negative determination circuit and outputs the result.

27. The phase adjustment circuit of claim 23, wherein the delay-control-signal generating circuit further includes:
　　a first multiplier for multiplying the output from the subtractor by a first coefficient and outputting the result;
　　a second multiplier for multiplying the output from the subtractor by a second coefficient and outputting the result;
　　a comparator for comparing the output from the subtractor with the value of a control signal input to the comparator, and outputting the result; and
　　a selector for selecting one of the outputs from the first and second multipliers, in accordance with the output from the comparator, and
　　the integrator integrates the output from the selector and outputs the result.

28. The phase adjustment circuit of claim 22, wherein the delay-control-signal generating circuit includes:
　　a comparator for comparing the phase information with a first value and outputting the result of the comparison;
　　an integrator for integrating the result of the comparison and outputting the result of the integration; and
　　an adder for adding a second value to the output from the integrator and outputting the result as the delay control signal.

29. The phase adjustment circuit of claim 22, wherein the delay selecting circuit includes:
　　a delay circuit for providing a delay to the input carrier wave and generating and outputting a plurality of carrier waves respectively provided with different delays; and
　　a selector for selecting one of the plurality of carrier waves and outputting the selected carrier wave, in accordance with the delay control signal.

30. A demodulation circuit, comprising:
　　a phase adjustment circuit including
　　　　a carrier-wave-delay adjusting circuit for delaying an input carrier wave and outputting the delayed carrier wave, in accordance with phase information, the carrier-wave-delay adjusting circuit delaying the input carrier wave in such a manner that the delayed carrier wave or a carrier wave generated from the delayed carrier wave is output as a phase-adjusted carrier wave having a phase substantially coincident with a phase of the input signal, and
　　　　a phase-difference detecting circuit for detecting a phase difference between an input signal and a signal according to the detected carrier wave, and outputting, as the phase information, a value according to the detected phase difference, the phase-difference detecting circuit outputting, as the phase information, a value indicating the presence of a phase difference in a steady state;
　　a multiplier for multiplying the input signal and the phase-adjusted carrier wave together; and
　　a binarization circuit for comparing the result of the multiplication by the multiplier with a threshold value and outputting the result of the comparison.

* * * * *